US012727312B2

(12) United States Patent
Zhang et al.

(10) Patent No.: US 12,727,312 B2
(45) Date of Patent: Sep. 1, 2026

(54) MICRO LIGHT-EMITTING DIODE CHIP, MANUFACTURING METHOD THEREFOR, AND ELECTRONIC DEVICE

(71) Applicant: ENKRIS SEMICONDUCTOR, INC., Suzhou (CN)

(72) Inventors: Liyang Zhang, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 418 days.

(21) Appl. No.: 18/345,383

(22) Filed: Jun. 30, 2023

(65) Prior Publication Data

US 2024/0006465 A1 Jan. 4, 2024

(30) Foreign Application Priority Data

Jul. 1, 2022 (CN) ........................ 202210769604.7

(51) Int. Cl.
*H10H 29/14* (2025.01)

(52) U.S. Cl.
CPC ................................ *H10H 29/142* (2025.01)

(58) Field of Classification Search
CPC ............................ H10H 29/14; H10H 29/142
USPC .................................................. 313/498–512
See application file for complete search history.

(56) References Cited

U.S. PATENT DOCUMENTS

2022/0334439 A1* 10/2022 Zhang .................... G02B 1/005
2022/0352425 A1* 11/2022 Kim .................... H01L 25/0753
2022/0384516 A1* 12/2022 Tan ......................... H01L 25/18
2023/0064954 A1* 3/2023 Cheng .................... H10H 20/01
2025/0212570 A1* 6/2025 Tseng ................... H10H 20/841
2025/0275341 A1* 8/2025 Zhang .................... H10H 29/37

* cited by examiner

*Primary Examiner* — Christopher M Raabe
(74) *Attorney, Agent, or Firm* — Westbridge IP LLC

(57) ABSTRACT

Disclosed are a micro light-emitting diode chip, a manufacturing method therefor, and an electronic device. The micro light-emitting diode chip includes: a substrate; a plurality of light-emitting units, where a light-emitting unit is located on a side of the substrate, the light-emitting unit includes a first semiconductor layer, an active layer and a second semiconductor layer stacked in sequence, the first semiconductor layer is located on a side, away from the substrate, of the second semiconductor layer, and the light-emitting unit further includes a reflective sidewall, which constitutes a sidewall of the active layer, the second semiconductor layer and at least a part of the first semiconductor layer; and a blocking portion, where at least a part of the blocking portion is located between first semiconductor layers of two of the light-emitting units.

13 Claims, 13 Drawing Sheets

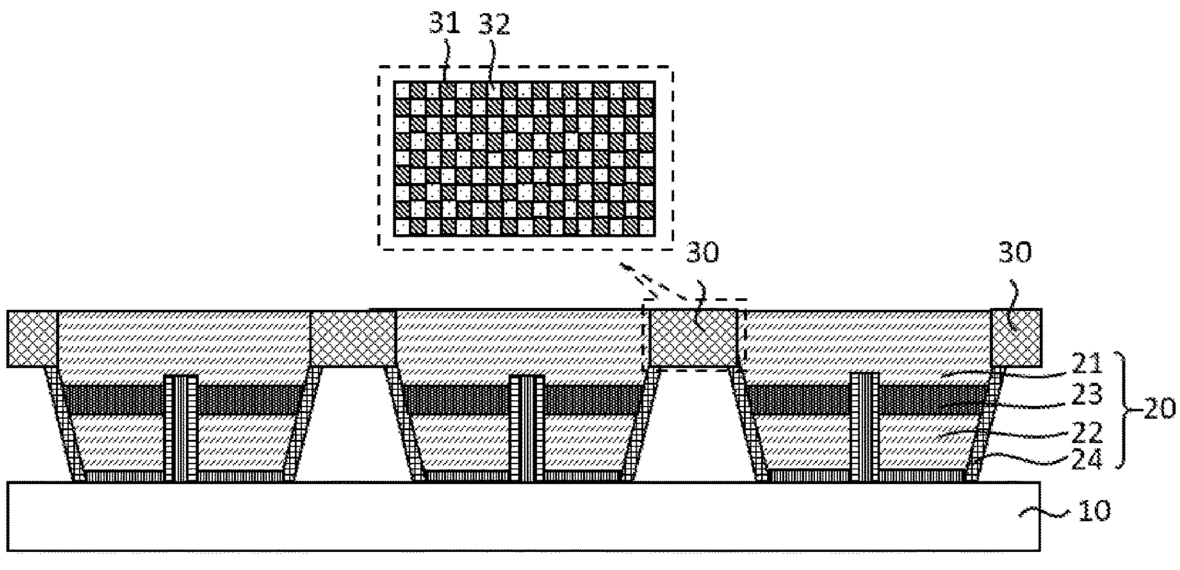
FIG. 3
FIG. 4
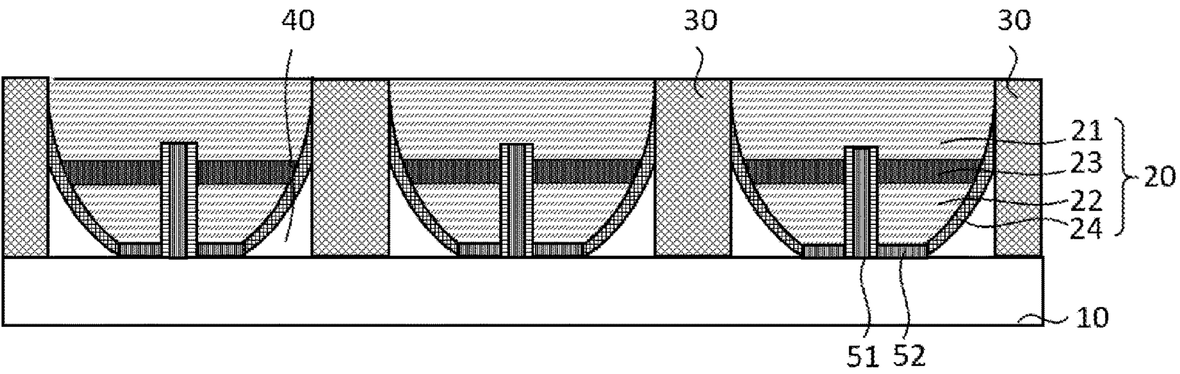
FIG. 5

MICRO LIGHT-EMITTING DIODE CHIP, MANUFACTURING METHOD THEREFOR, AND ELECTRONIC DEVICE

CROSS-REFERENCE TO RELATED APPLICATIONS

The present application claims priority to Chinese Patent Application No. 202210769604.7, filed on Jul. 1, 2022, which is hereby incorporated by reference in its entirety.

TECHNICAL FIELD

The present disclosure relates to the field of semiconductor technologies, and in particular, to a micro light-emitting diode chip, a manufacturing method for the micro light-emitting diode chip, and an electronic device.

BACKGROUND

Micro Light-Emitting Diode (Micro LED), as a new generation of display technology, has advantages of higher brightness, better luminous efficiency, lower power consumption and the like than existing Liquid Crystal Display (LCD) and Organic Light-Emitting Diode (OLED) technologies. With the development of technology, requirements for display resolution are increasingly strict, and micro LEDs are gradually developing towards thin-film, miniaturization, and array. A size of a single micro LED can be as small as within a hundred microns, or even 1-5 μm.

At the same time, a small spacing between micro LEDs leads to issues such as color crosstalk between adjacent micro LEDs, which affects a display effect and reduces user experience satisfaction.

SUMMARY

In view of this, embodiments of the present disclosure provide a micro light-emitting diode chip and a manufacturing method therefor to solve a technical problem of color crosstalk caused by the small spacing between micro LEDs in a related art.

According to an aspect of the present disclosure, a micro light-emitting diode chip is provided by an embodiment of the present disclosure, and the micro light-emitting diode chip includes: a substrate; a plurality of light-emitting units, where a light-emitting unit is located on a side of the substrate, the light-emitting unit includes a first semiconductor layer, an active layer and a second semiconductor layer stacked in sequence, the first semiconductor layer is located on a side, away from the substrate, of the second semiconductor layer, and the light-emitting unit further includes a reflective sidewall, which constitutes a sidewall of the active layer, the second semiconductor layer and at least a part of the first semiconductor layer; and a blocking portion, where at least a part of the blocking portion is located between first semiconductor layers of two of the light-emitting units.

In an embodiment, the blocking portion is a photonic crystal.

In an embodiment, the reflective sidewall is a distributed Bragg reflector.

In an embodiment, in the light-emitting unit, along a direction parallel to the substrate, a length of the first semiconductor layer is greater than a length of the second semiconductor layer.

In an embodiment, a shape, along a direction perpendicular to the substrate, of the reflective sidewall is curved or linear.

In an embodiment, the micro light-emitting diode chip further includes: a passivation layer located on a side, near the active layer, of the reflective sidewall.

In an embodiment, the micro light-emitting diode chip further includes: an insulating layer located between reflective sidewalls of two of the light-emitting units.

In an embodiment, the micro light-emitting diode chip further includes: a first electrode, where along a direction perpendicular to the substrate, the first electrode penetrates through the active layer and the second semiconductor layer and is electrically connected to the first semiconductor layer, and the first electrode is configured to provide an electrical signal for the first semiconductor layer; and/or a second electrode, where the second electrode is electrically connected to the second semiconductor layer, and the second electrode is configured to provide an electrical signal for the second semiconductor layer.

In an embodiment, the micro light-emitting diode chip further includes a metal reflective layer located on a side, away from the active layer, of the second semiconductor layer, where the second electrode is electrically connected to the second semiconductor layer through the metal reflective layer.

In an embodiment, the micro light-emitting diode chip further includes a conductive layer located between the metal reflective layer and the second semiconductor layer.

According to another aspect of the present disclosure, a manufacturing method for a micro light-emitting diode chip is provided by an embodiment of the present disclosure, and the manufacturing method includes:

- forming a first semiconductor layer, an active layer and a second semiconductor layer that are stacked on a side of an underlayment in sequence;
- forming a plurality of light-emitting units by patterning and etching the active layer, the second semiconductor layer and at least a part of the first semiconductor layer;
- forming a reflective sidewall on a side, away from the underlayment, of the second semiconductor layer, where the reflective sidewall constitutes a sidewall of the active layer, the second semiconductor layer and at least a part of the first semiconductor layer;
- inverting and transferring the underlayment and a light-emitting unit onto a substrate, where the light-emitting unit is located between the underlayment and the substrate;
- removing the underlayment, where the first semiconductor layer is located on a side, away from the substrate, of the second semiconductor layer;
- forming a first trench by etching the first semiconductor layer between two of the light-emitting units; and
- forming a blocking portion in the first trench, where at least a part of the blocking portion is located between first semiconductor layers of two of the light-emitting units.

In an embodiment, the forming a plurality of light-emitting units by patterning and etching the active layer, the second semiconductor layer and at least a part of the first semiconductor layer includes:

- forming a patterned photoresist layer on the second semiconductor layer, where along a direction parallel to the underlayment, a length, near the underlayment, of the photoresist layer is greater than a length, away from the underlayment, of the photoresist layer; and forming the plurality of light-emitting units by photoetching the active layer, the second semiconductor layer and at least a part of the first semiconductor layer, and enabling the active layer, the second semiconductor layer and at least a part of the first semiconductor layer to copy a shape of the photoresist layer, where in the light-emitting unit, along a direction parallel to the underlayment, a length of the first semiconductor layer is greater than a length of the second semiconductor layer.

In an embodiment, a shape, along a direction perpendicular to the underlayment, of the reflective sidewall is curved or linear.

In an embodiment, before the forming a reflective sidewall on a side, away from the underlayment, of the second semiconductor layer, the manufacturing method further includes: forming a passivation layer on the side, away from the underlayment, of the second semiconductor layer, where the passivation layer is located on a side, near the active layer, of the reflective sidewall.

In an embodiment, before the inverting and transferring the underlayment and a light-emitting unit onto a substrate, the manufacturing method further includes: forming an insulating layer on a side, away from the underlayment, of the reflective sidewall; and flattening the insulating layer by chemical mechanical polishing.

In an embodiment, before the inverting and transferring the underlayment and a light-emitting unit onto a substrate, the manufacturing method further includes: forming a second trench by etching the insulating layer and the reflective sidewall in the light-emitting unit, where the second trench exposes the second semiconductor layer; and forming a conductive layer and a metal reflective layer in the second trench in sequence.

In an embodiment, before the inverting and transferring the underlayment and a light-emitting unit onto a substrate, the manufacturing method further includes: forming a third trench by etching the metal reflective layer, the conductive layer, the second semiconductor layer, the active layer and at least a part of the first semiconductor layer, where the third trench is configured to form a first electrode which is configured to provide an electrical signal for the first semiconductor layer; and forming a second electrode on a side, away from the underlayment, of the metal reflective layer, where the second electrode is configured to provide an electrical signal for the second semiconductor layer.

BRIEF DESCRIPTION OF THE DRAWINGS

FIG. 3 is a structural schematic diagram of a micro light-emitting diode chip according to another embodiment of the present disclosure.

FIG. 4 is a structural schematic diagram of a micro light-emitting diode chip according to another embodiment of the present disclosure.

FIG. 5 is a structural schematic diagram of a micro light-emitting diode chip according to another embodiment of the present disclosure.

DETAILED DESCRIPTION OF THE EMBODIMENTS

Technical solutions in embodiments of the present disclosure are described clearly and completely below with reference to the drawings of the embodiments of the present disclosure. Apparently, the described embodiments are only a part, but not all of the embodiments of the present disclosure. All other embodiments that may be obtained by those of ordinary skill in the art based on the embodiments in the present disclosure without any inventive efforts fall into the protection scope of the present disclosure.

As mentioned above, high-resolution micro LEDs have problems such as color crosstalk between micro LED units due to too small spacing between them.

In order to solve the above problems, a micro light-emitting diode chip and a manufacturing method therefor provided by the present disclosure are illustrated through further examples with reference to FIG. 1 to FIG. 25.

Figure 1:
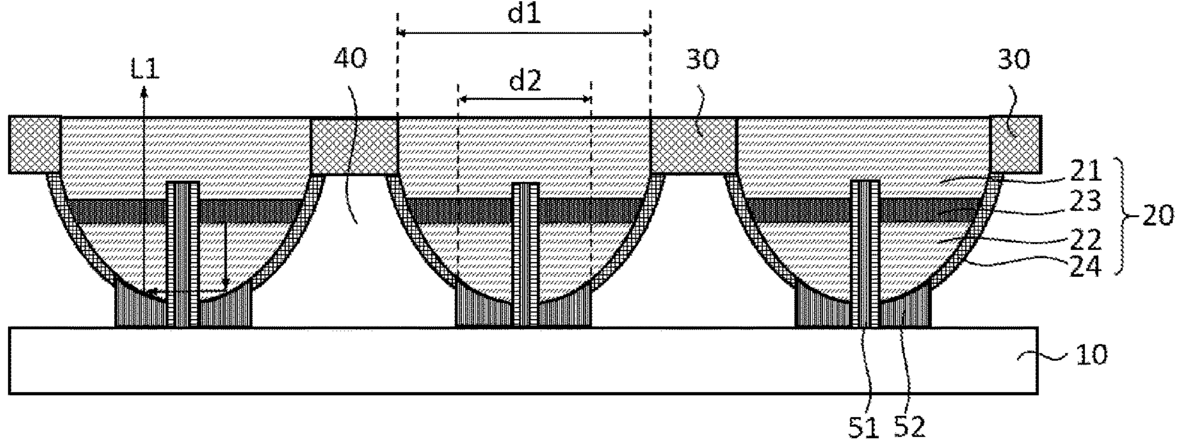
FIG. 1 is a structural schematic diagram of a micro light-emitting diode chip according to an embodiment of the present disclosure.

FIG. 1 is a structural schematic diagram of a micro light-emitting diode chip according to an embodiment of the present disclosure. As shown in FIG. 1, the micro light-emitting diode chip includes: a substrate 10; a plurality of light-emitting units 20, where a light-emitting unit 20 is located on a side of the substrate 10, the light-emitting unit 20 includes a first semiconductor layer 21, an active layer 23 and a second semiconductor layer 22 stacked in sequence, the first semiconductor layer 21 is located on a side, away from the substrate 10, of the second semiconductor layer 22, and the light-emitting unit 20 further includes a reflective sidewall 24, which constitutes a sidewall of the active layer 23, the second semiconductor layer 22 and at least a part of the first semiconductor layer 21; and a blocking portion 30, where at least a part of the blocking portion 30 is located between first semiconductor layers 21 of two of the light-emitting units 20.

Specifically, the substrate 10 may be made of an underlayment material used to carry a micro light-emitting diode chip, such as glass, sapphire, silicon-based underlayment. Those skilled in the art may choose a suitable substrate according to actual needs. Optionally, the substrate 10 may be a driving circuit board that provides an electrical signal for the micro light-emitting diode chip.

Specifically, the light-emitting unit 20 is located on a side of the substrate 10, and it is may be that the plurality of light-emitting units 20 are located on one side of a plane where the substrate 10 is located. Optionally, both sides of the plane where the substrate 10 is located include the plurality of light-emitting units 20.

Specifically, the light-emitting unit 20 includes the first semiconductor layer 21, the active layer 23 and the second semiconductor layer 22 stacked in sequence, and the first semiconductor layer 21 is located on the side, away from the substrate 10, of the second semiconductor layer 22. Conductive types of the first semiconductor layer 21 and the second semiconductor layer 22 are opposite, for example, the first semiconductor layer 21 is an N-type doped semiconductor material, and the second semiconductor layer 22 is a P-type doped semiconductor material. Optionally, the first semiconductor layer 21 is a P-type doped semiconductor material, and the second semiconductor layer 22 is an N-type doped semiconductor material. The first semiconductor layer 21, the second semiconductor layer 22, or the active layer 23 may be a group III-V semiconductor material, such as a gallium nitride-based semiconductor material.

Specifically, the light-emitting unit 20 also includes the reflective sidewall 24, which constitutes the sidewall of the active layer 23, the second semiconductor layer 22 and at least a part of the first semiconductor layer 21. In the light-emitting unit 20, electron-hole recombination happens in the active layer 23 to achieve light emitting. The active layer 23 emits light towards the first semiconductor layer 21 and the second semiconductor layer 22, and a direction of the light emitted towards the first semiconductor layer 21 is a light emitting direction of the micro light-emitting diode chip. The light emitted towards the second semiconductor layer 22 is reflected by the reflective sidewall 24, and then emitted towards the first semiconductor layer 21.

Specifically, the micro light-emitting diode chip also includes the blocking portion 30, at least a part of the blocking portion 30 is located between first semiconductor layers 21 of two light-emitting units 20. The blocking portion 30 has a blocking or reflecting effect on the light in the first semiconductor layer 21, and the blocking portion 30 may prevent light crosstalk between the first semiconductor layers 21 of two adjacent light-emitting units 20, and make the light in the first semiconductor layer 21 of the light-emitting unit 20 emit towards a direction away from the substrate 10. The reflective sidewall 24 constitutes a sidewall of at least a part of the first semiconductor layer 21, and the blocking portion 30 constitutes a sidewall of at least a remaining part of the first semiconductor layer 21, in other words, the reflective sidewall 24 and the blocking portion 30 make the light of the micro light-emitting diode chip emit from the active layer 23 to a direction away from the substrate 10.

The reflective sidewall 24 reflects the light emitted from the active layer 23 at least once, and emits the light towards a side where the first semiconductor layer 21 is located. The blocking portion 30 may prevent color crosstalk between the first semiconductor layers 21 of two light-emitting units 20, and modulate the light emitting angle of the light, so that the emergent light is collected to be close to a collimated light for emission, which is beneficial to improving brightness, thereby improving a display effect.

Figure 2:
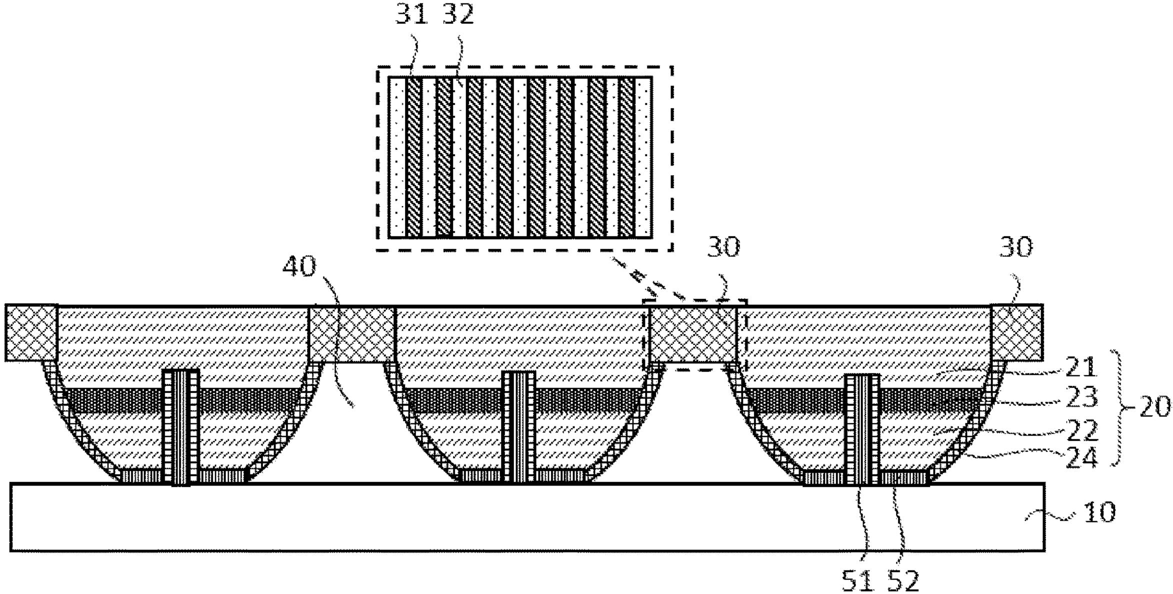
FIG. 2 is a structural schematic diagram of a micro light-emitting diode chip according to another embodiment of the present disclosure.

It should be noted that as shown in FIG. 1, a surface, away from the active layer 23, of the second semiconductor layer 22 may be a curved surface. Optionally, as shown in FIG. 2 which is a structural schematic diagram of a micro light-emitting diode chip according to another embodiment of the present disclosure, the surface, away from the active layer 23, of the second semiconductor layer 22 may be a plane. It should be noted that other embodiments of the present disclosure are described and illustrated by taking the surface, away from the active layer 23, of the second semiconductor layer 22 as a plane, and other embodiments of the present disclosure may also adopt a structure in which the surface, away from the active layer 23, of the second semiconductor layer 22 is a curved surface.

It should be noted that in the present disclosure, dimensions of each structure shown in the drawings do not represent real dimensions. The drawings are only intended to illustrate positional relationships of various structures and those skilled in the art may choose to manufacture various structures with appropriate sizes based on an actual size need of a micro light-emitting diode chip. Specifically, in a direction perpendicular to a plane where the substrate 10 is located, a thickness of the substrate 10 may be hundreds of microns, and specifically may be 725 μm. A thickness of the light-emitting unit 20 may be microns, and specifically may be 3 μm. As shown in FIG. 1, although the thickness, in the direction perpendicular to the plane where the substrate 10 is located of the light-emitting unit 20 is greater than the thickness, in the direction perpendicular to the plane where the substrate 10 is located, of the substrate 10, it is only used for a clearer illustration of the various structures of the light-emitting unit 20 and is not a limitation on the thicknesses of the light-emitting unit 20 and the substrate 10.

In an embodiment, the blocking portion 30 is a photonic crystal.

The photonic crystal is a kind of artificial microstructure composed of periodically arranged media with different refractive indexes, which has a wavelength selection function and may selectively allow light in a specific band to pass through and prevent light in other bands from passing through. In the present disclosure, the light may be prevented from entering the photonic crystal by adjusting the photon energy of the light emitted from the light-emitting unit to be located in a photonic band gap of the photonic crystal, that is, the problem of color crosstalk between the first semiconductor layers of adjacent light-emitting units may be solved. The photonic crystal may be a two-dimensional photonic crystal, including a cylindrical rod arranged vertically or horizontally, the vertical indicates a direction perpendicular to the plane where the substrate is located, and the horizontal indicates a direction parallel to the plane where the substrate is located. As shown in FIG. 3, the photonic crystal may also be a three-dimensional photonic crystal, including a vertical cylinder, a sphere, a wood pile type, and a combination of these. The photonic crystal may include a pair of materials, such as $SiO_2$ and $TiO_2$.

Specifically, the blocking portion may be a Distributed Bragg Reflection (DBR), which is a kind of periodic structure composed of two materials with different refractive indexes arranged alternately. The DBR may be considered as a one-dimensional photonic crystal when it is made into a structure formed by two film layers with different refractive indexes arranged alternately. As shown in FIG. 2, the blocking portion 30 is a one-dimensional photonic crystal. In the present disclosure, the photon energy of the light emitted from the light-emitting unit may be located in an energy gap range of the DBR by adjusting an optical thickness of each material layer to ¼ times the wavelength of the light emitted from the light-emitting unit, so that the light may be reflected and the reflectivity may reach 99%.

Compared with a conventional technology in which a black glue is used as an isolation and light-blocking structure, in the present disclosure, the photonic crystal or DBR is used to prepare the blocking portion, which not only has an advantage of high structural reliability, but also may avoid a problem of light absorption by the black glue, so that a light emitting efficiency of the micro light-emitting diode chip may be further improved.

It should be noted that, as shown in FIG. 1, when using the DBR to prepare the blocking portion, a direction of an alternating arrangement of two materials with different refractive indexes is perpendicular to the light emitting direction, that is, the direction of the alternating arrangement of the two materials is parallel to the plane where the substrate 10 is located, thereby achieving a reflection effect of the DBR.

In an embodiment, the reflective sidewall 24 is a DBR.

The reflective sidewall 24 may be a DBR, selected from a group of multiple period material pairs with different refractive indexes, including oxides such as $TiO_2/SiO_2$, $Ti_3O_5/SiO_2$, $Ta_2O_5/SiO_2$, $Ti_3O_5/Al_2O_3$, $ZrO_2/SiO_2$, or $TiO_2/Al_2O_3$. The reflectivity of the reflective sidewall 24 to light, whose wavelength is close to the wavelength of the light emitted from the light-emitting unit, is not less than 90%, which is beneficial to improving the light emitting efficiency of the micro light-emitting diode chip.

It should be noted that, as shown in FIG. 1, when using the DBR to prepare the reflective sidewall, a direction of an alternating arrangement of two materials with different refractive indexes is perpendicular to a tangent plane where the reflective sidewall 24 is located, that is, the two materials are alternately arranged on a side, near the substrate 10, of the first semiconductor layer 21, the active layer 23, and the second semiconductor layer 22. The reflective sidewall 24 constitutes the sidewall of the active layer 23, the second semiconductor layer 22 and at least a part of the first semiconductor layer 21, thereby achieving a reflection effect of the DBR.

In an embodiment, as shown in FIG. 1, in a light-emitting unit 20, along a direction parallel to the substrate 10, a length d1 of the first semiconductor layer 21 is greater than a length d2 of the second semiconductor layer 22.

Specifically, as shown in FIG. 1, along the direction parallel to the substrate 10, the length d1 of the first semiconductor layer 21 is greater than the length d2 of the second semiconductor layer 22, that is, the light-emitting unit 20 presents a bowl shape. A larger opening of the bowl shape is toward a direction of the first semiconductor layer 21, and an included angle formed by the tangent plane where the reflective sidewall 24 is located and the plane where the substrate 10 is located is not perpendicular, or presents an acute angle, so that most of the light L1 emitted from the active layer 23 in the light-emitting unit 20 is reflected by the reflective sidewall 24 and then emitted in a direction away from the substrate 10. Compared with a vertical reflective sidewall in a conventional technology, the bowl shape of the reflective sidewall 24 in the present disclosure is beneficial to improving the light emitting efficiency of the micro light-emitting diode chip.

In an embodiment, as shown in FIGS. 1 to 3, FIG. 3 is a structural schematic diagram of a micro light-emitting diode chip according to another embodiment of the present disclosure, a shape, along a direction perpendicular to the substrate 10, of the reflective sidewall is linear or curved.

Specifically, as shown in FIG. 3, the shape, along the direction perpendicular to the substrate 10, of the reflective sidewall 24 is linear. An included angle formed by the tangent plane where the reflective sidewall 24 is located and the plane where the substrate 10 is located is an acute angle, so that most of the light emitted from the active layer 23 in the light-emitting unit 20 is reflected by the reflective sidewall 24 and then emitted in a direction away from the substrate 10. The bowl shape of the reflective sidewall 24 is beneficial to improving the light emitting efficiency of the micro light-emitting diode chip.

As shown in FIGS. 1 and 2, the shape, along the direction perpendicular to the substrate 10, of the reflective sidewall 24 is curved. Along the direction perpendicular to the substrate 10, there are countless tangent planes of the reflective sidewall 24, thereby increasing a reflection probability of light on the reflective sidewall 24, making the light concentrated, and further allowing the light to emit from the light-emitting unit 20 in a manner close to a collimated light. This is not only beneficial to improving the light emitting efficiency of the micro light-emitting diode chip, but also can adjust a light emitting angle by controlling a curvature of the curved reflective sidewall to achieve an effect of directional light emitting.

It should be noted that, alternatively, the shape, along the direction perpendicular to the substrate 10, of the reflective sidewall 24 may be formed by a plurality of arcs or broken lines, and the formed reflective sidewall 24 has an uneven surface, thereby improving the light emitting efficiency of the micro light-emitting diode chip. Optionally, a light emitting angle may be adjusted by controlling an overall curvature of the reflective sidewall to achieve an effect of directional light emitting.

In an embodiment, as shown in FIG. 4, FIG. 4 is a structural schematic diagram of a micro light-emitting diode chip according to another embodiment of the present disclosure, the micro light-emitting diode chip further includes a passivation layer 25 located on a side, near the active layer 23, of the reflective sidewall 24.

Specifically, as shown in FIG. 4, the passivation layer 25 is disposed between the reflective sidewall 24 and the first semiconductor layer 21, the active layer 23, and the second semiconductor layer 22. On a side near the substrate 10, the passivation layer 25 may cover the first semiconductor layer 21, the active layer 23 and the second semiconductor layer 22 to protect the first semiconductor layer 21, the active layer 23 and the second semiconductor layer 22 from being affected by a subsequent preparation process, such as a process of preparing the reflective sidewall 24. Furthermore, forming a dense passivation layer 25 is beneficial to preparing a thin-layer structure of the reflective sidewall 24. The passivation layer 25 may be $Al_2O_3$, AlN, $SiO_2$, SiN, SiON, $HfO_2$, $ZrO_2$, $Y_2O_3$, $La_2O_3$ or $Ta_2O_5$, with high compactness and good coverage.

In an embodiment, as shown in FIG. 1, the micro light-emitting diode chip further includes an insulating layer 40 located between reflective sidewalls 24 of two of the light-emitting units 20.

Specifically, as shown in FIG. 1, the insulating layer 40 is located between the reflective sidewalls 24 of two light-emitting units 20, and the insulating layer 40 is used to accommodate the light-emitting units 20. In other words, when the light-emitting units 20 are arranged in an array on a plane parallel to the substrate 10, the insulating layer 40 includes a trench array that can be used to accommodate the light-emitting units 20. The insulating layer 40 may be SiCN, $SiO_2$, SiN, $Al_2O_3$, $HfO_2$, $ZrO_2$, or $Ta_2O_5$.

It should be noted that, as shown in FIG. 1, along the direction perpendicular to the substrate 10, the blocking portion 30 is located in a direction of the insulating layer 40 away from the substrate 10.

Optionally, as shown in FIG. 5, FIG. 5 is a structural schematic diagram of a micro light-emitting diode chip according to another embodiment of the present disclosure, the blocking portion 30 penetrates through the insulating layer 40, and there is a reflective sidewall 24 and a blocking portion 30 between two light-emitting units 20. The reflective sidewall 24 may be a DBR, and the blocking portion 30 may be a photonic crystal or DBR, so as to provide a dual guarantee to avoid color crosstalk between two light-emitting units 20, and improve brightness, thereby improving the display effect.

In an embodiment, as shown in FIG. 1, the micro light-emitting diode chip further includes a first electrode 51, along a direction perpendicular to the substrate 10, the first electrode 51 penetrates through the active layer 23 and the second semiconductor layer 22 and is electrically connected to the first semiconductor layer 21, and the first electrode 51 is configured to provide an electrical signal for the first semiconductor layer 21; and/or, the micro light-emitting diode chip further includes a second electrode 52, and the second electrode 52 is electrically connected to the second semiconductor layer 22 and is configured to provide an electrical signal for the second semiconductor layer 22.

Specifically, as shown in FIG. 1, the first electrode 51 penetrates through the active layer 23 and the second semiconductor layer 22, and is electrically connected to the first semiconductor layer 21 to form a circuit path for the first semiconductor layer 21 and a driving circuit. The first electrode 51 is configured to provide an electrical signal for the first semiconductor layer 21. The second electrode 52 is electrically connected to the second semiconductor layer 22 to form a circuit path for the second semiconductor layer 22 and the driving circuit. The second electrode 52 is configured to provide an electrical signal for the second semiconductor layer 22. The first electrode 51 and the second electrode 52 may be Cu, Ag, Au, Al, W, Mo, Ni, Ti, Pt, or Pd.

It should be noted that the substrate 10 may include a driving circuit used to provide driving signals for the micro light-emitting diode chip. Therefore, the first electrode 51 is electrically connected to the first semiconductor layer 21 and the driving circuit on the substrate 10, and the second electrode 52 is electrically connected to the second semiconductor layer 22 and the driving circuit on the substrate 10. Optionally, a driving circuit board is disposed on a side, away from the light-emitting units 20, of the substrate 10, the first electrode 51 penetrates through the active layer 23, the second semiconductor layer 22 and the substrate 10, and is electrically connected to the driving circuit board, and the second electrode 52 penetrates through the substrate 10 and is electrically connected to the driving circuit board. The drawings in the present disclosure only illustrate that the substrate 10 includes a driving circuit, and a manner of additionally setting a driving circuit board may also be adopted in the present disclosure. The present disclosure does not limit a setting mode of a driving circuit, and those skilled in the art can make a reasonable choice of the setting mode of a driving circuit according to actual needs.

Figure 6:
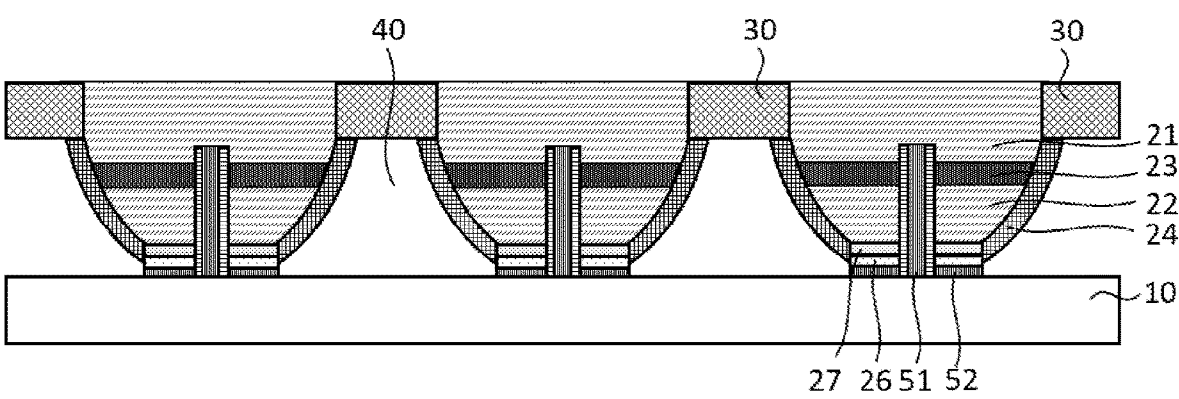
FIG. 6 is a structural schematic diagram of a micro light-emitting diode chip according to another embodiment of the present disclosure.

In an embodiment, as shown in FIG. 6, FIG. 6 is a structural schematic diagram of a micro light-emitting diode chip according to another embodiment of the present disclosure, the micro light-emitting diode chip further includes a metal reflective layer 26 located on a side, away from the active layer 23, of the second semiconductor layer 22, and the second electrode 52 is electrically connected to the second semiconductor layer 22 through the metal reflective layer 26.

Specifically, as shown in FIG. 6, the metal reflective layer 26 is located between the second electrode 52 and the second semiconductor layer 22. Firstly, a position where the second electrode 52 is disposed has a lower reflectivity for the light emitted from the active layer 52 towards the second semiconductor layer 22, and the metal reflective layer 26 may improve the problem of low reflection for the light emitted from the active layer 23, which is caused by the setting of the second electrode 52. The metal reflective layer 26 may include Ag, which has a high reflectivity for light. Secondly, the metal reflective layer 26 has a current conduction characteristic of a metal, and the second semiconductor layer 22 is electrically connected to the driving circuit through the metal reflective layer 26 and the second electrode 52, so that a electrical connection may be achieved. Optionally, the metal reflective layer 26 may include Ni to reduce a contact resistance between the second electrode 52 and the second semiconductor layer 22. Optionally, the metal reflective layer 26 may be composed of a Ni metal layer and an Ag metal layer, and the Ni metal layer is located on a side, near the second semiconductor layer 22, of the Ag metal layer.

In an embodiment, as shown in FIG. 6, the micro light-emitting diode chip further includes a conductive layer 27 located between the metal reflective layer 26 and the second semiconductor layer 22.

Specifically, as shown in FIG. 6, the conductive layer 27 may be a transparent conductive material, such as Indium Tin Oxide (ITO), located between the metal reflection layer 26 and the second semiconductor layer 22, which may expand a current of the second electrode 52, so that a current entering the second semiconductor layer 22 may be more uniformly distributed, which is beneficial to improving the luminous efficiency of the micro light-emitting diode chip.

Figure 30:
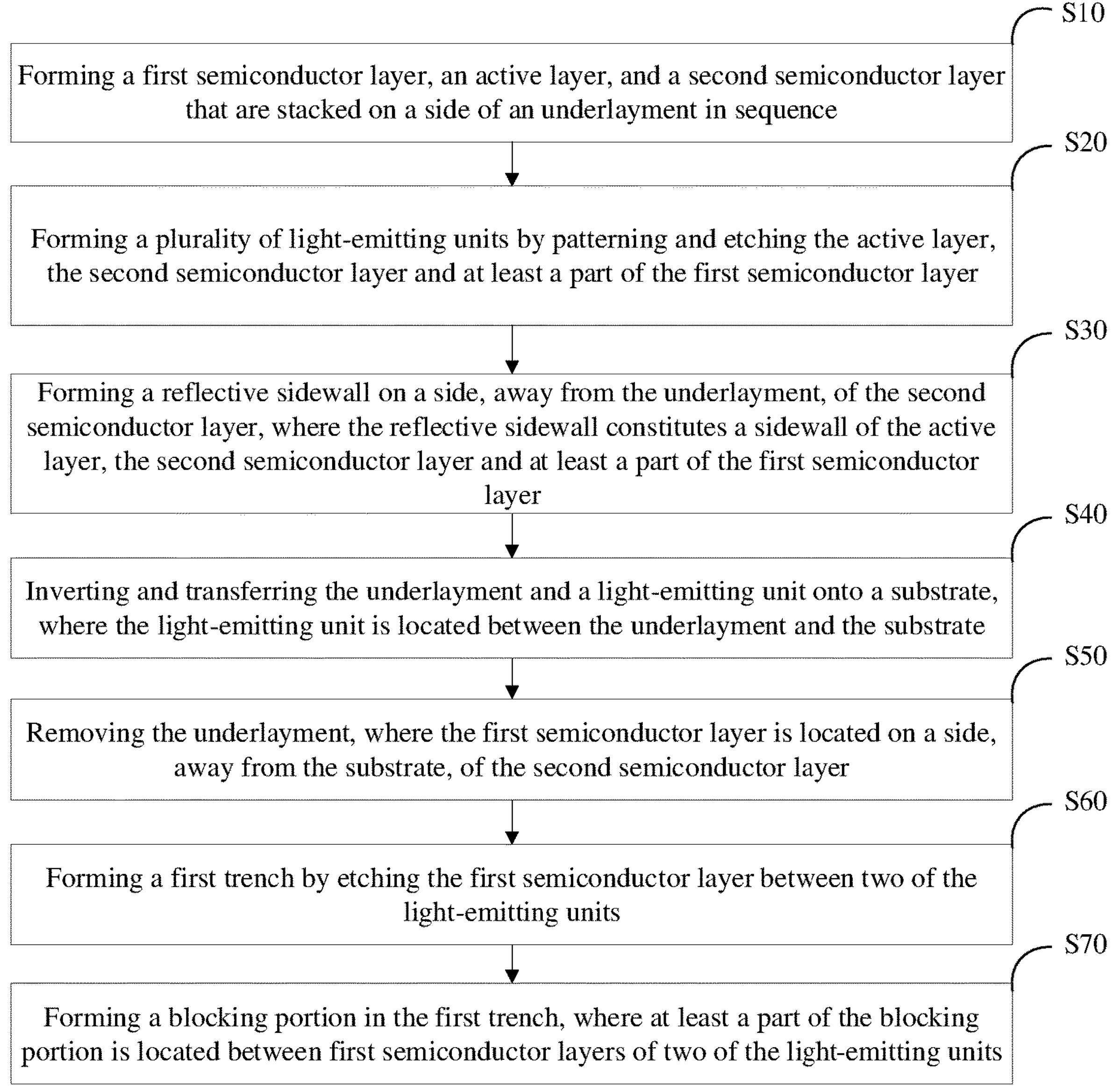
FIG. 30 is a schematic flowchart of a manufacturing method for a micro light-emitting diode chip according to an embodiment of the present disclosure.

According to another aspect of the present disclosure, a manufacturing method for a micro light-emitting diode chip is provided by an embodiment of the present disclosure. As shown in FIG. 30, the manufacturing method for a micro light-emitting diode chip includes the following contents.

S10: forming a first semiconductor layer, an active layer, and a second semiconductor layer that are stacked on a side of an underlayment in sequence.

S20: forming a plurality of light-emitting units by patterning and etching the active layer, the second semiconductor layer and at least a part of the first semiconductor layer.

S30: forming a reflective sidewall on a side, away from the underlayment, of the second semiconductor layer, where the reflective sidewall constitutes a sidewall of the active layer, the second semiconductor layer and at least a part of the first semiconductor layer.

S40: inverting and transferring the underlayment and a light-emitting unit onto a substrate, where the light-emitting unit is located between the underlayment and the substrate.

S50: removing the underlayment, where the first semiconductor layer is located on a side, away from the substrate, of the second semiconductor layer.

S60: forming a first trench by etching the first semiconductor layer between two of the light-emitting units.

S70: forming a blocking portion in the first trench, where at least a part of the blocking portion is located between first semiconductor layers of two of the light-emitting units.

Figure 7:
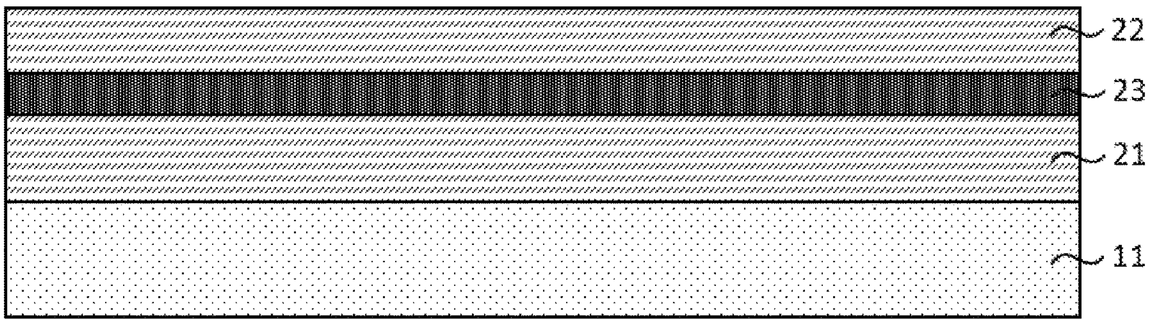
FIGS. 7 to 25 are structural schematic diagrams of semiconductor structures corresponding to each step in a manufacturing method for a micro light-emitting diode chip according to an embodiment of the present disclosure.

Specifically, FIGS. 7 to 25 are structural schematic diagrams of semiconductor structures corresponding to each step in a manufacturing method for a micro light-emitting diode chip according to an embodiment of the present disclosure, and as shown in FIG. 7, step S10 includes: forming a first semiconductor layer 21, an active layer 23 and a second semiconductor layer 22 that are stacked on a side of an underlayment 11 in sequence.

It should be noted that the underlayment 11 may be made of a sapphire, a silicon-based material, or a group III-V semiconductor material, and the material of the underlayment 11 is not limited in the present disclosure.

It should be noted that conductive types of the first semiconductor layer 21 and the second semiconductor layer 22 are opposite, for example, the first semiconductor layer 21 is an N-type doped semiconductor material, and the second semiconductor layer 22 is a P-type doped semiconductor material. Optionally, the first semiconductor layer 21 is a P-type doped semiconductor material, and the second semiconductor layer 22 is an N-type doped semiconductor material. The first semiconductor layer 21, the second semiconductor layer 22, or the active layer 23 may be a group III-V semiconductor material, such as a gallium nitride-based semiconductor material.

It should be noted that a growth process of the group III-V semiconductor material may include: Atomic Layer Deposition (ALD), Chemical Vapor Deposition (CVD), Molecular Beam Epitaxy (MBE), Plasma Enhanced Chemical Vapor Deposition (PECVD), Low Pressure Chemical Vapor Deposition (LPCVD), Metal-Organic Chemical Vapor Deposition (MOCVD), or a combination thereof. The present disclosure does not limit a preparation process of the first semiconductor layer 21, the second semiconductor layer 22, or the active layer 23.

Figure 8:
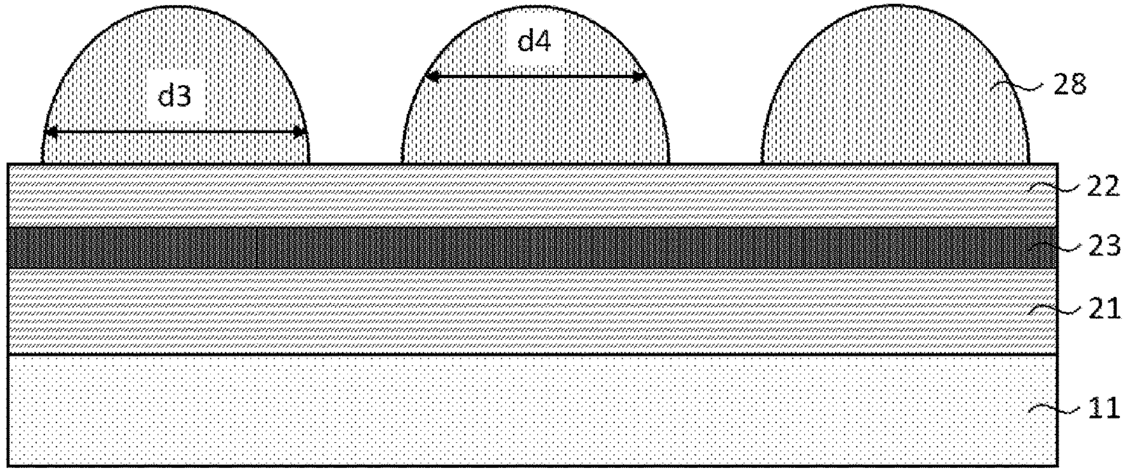
Figure 9:
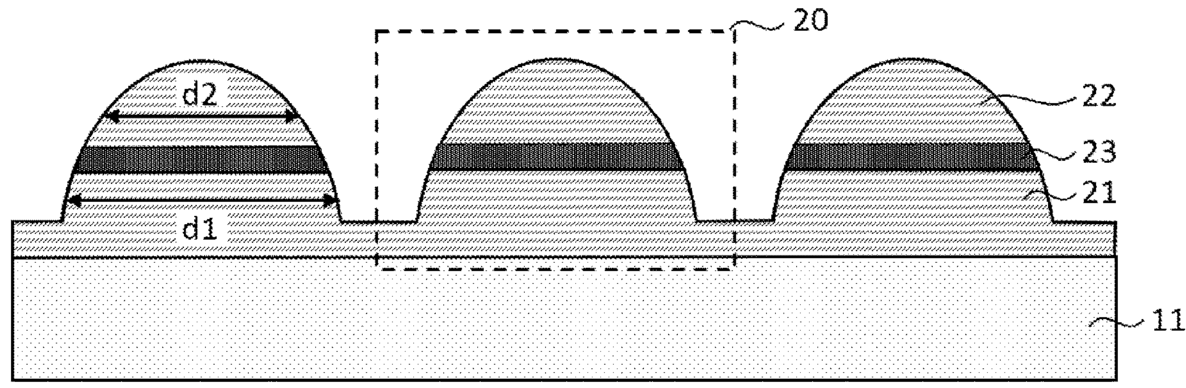

Specifically, as shown in FIGS. 8 and 9, step S20 includes: forming a plurality of light-emitting units 20 by patterning and etching the active layer 23, the second semiconductor layer 22 and at least a part of the first semiconductor layer 21.

It should be noted that, as shown in FIG. 9, a plurality of independent light-emitting units 20 are formed by patterning and etching the active layer 23, the second semiconductor layer 22 and at least a part of the first semiconductor layer 21 according to step S20. Optionally, the plurality of independent light-emitting units 20 present an array distribution.

Figure 11:
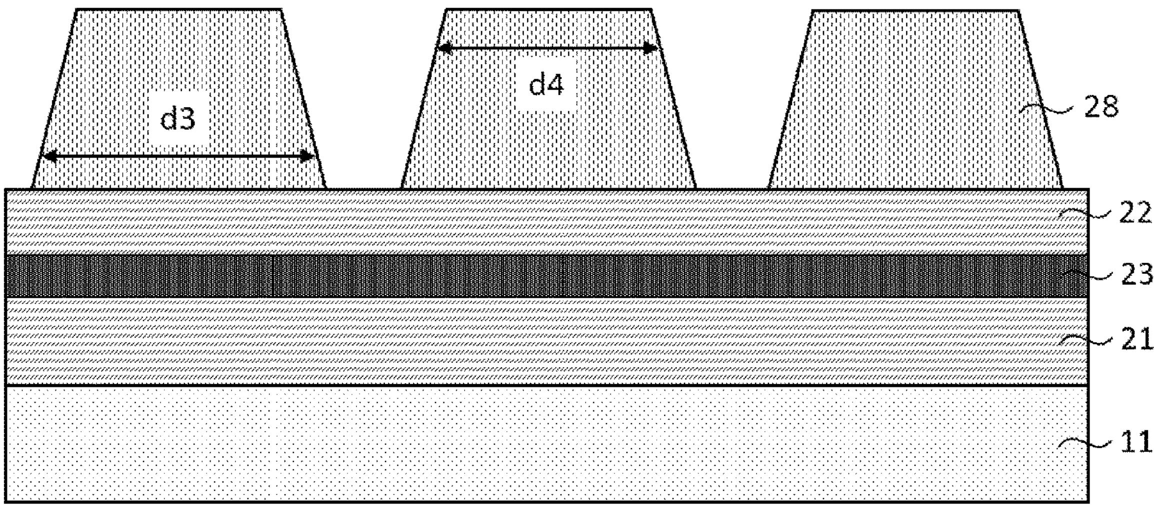
Figure 12:
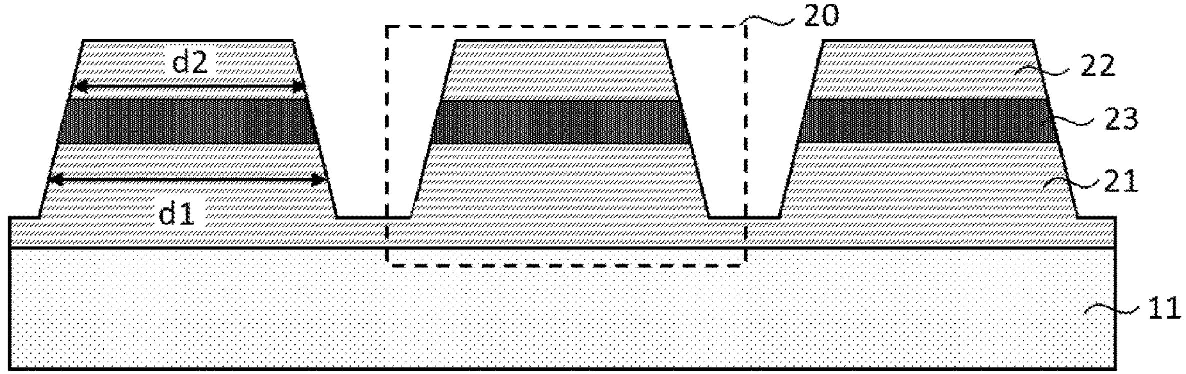

Specifically, in an embodiment, step S20 may include the following steps:

- as shown in FIGS. 8 and 11, forming a patterned photoresist layer 28 on the second semiconductor layer 22, where along a direction parallel to the underlayment 11, a length d3, near the underlayment 11, of the photoresist layer 28 is greater than a length d4, away from the underlayment 11, of the photoresist layer 28; and
- as shown in FIGS. 9 and 12, forming the plurality of light-emitting units 20 by photoetching the active layer 23, the second semiconductor layer 22 and at least a part of the first semiconductor layer 21, and enabling the active layer 23, the second semiconductor layer 22 and at least a part of the first semiconductor layer 21 to copy a shape of the photoresist layer 28, where in the light-emitting unit 20, along a direction parallel to the substrate 10, a length d1 of the first semiconductor layer 21 is greater than a length d2 of the second semiconductor layer 22.

It should be noted that the step of forming a patterned photoresist layer 28 on the second semiconductor layer 22 may include: forming a photoresist layer to be processed on the second semiconductor layer 22, and patterning the photoresist layer to be processed through a mask layer to form the photoresist layer 28 as shown in FIG. 8. Therefore, the length d3, near the underlayment 11, of the photoresist layer 28 is greater than the length d4, away from the underlayment 11, of the photoresist layer 28.

Figure 10:
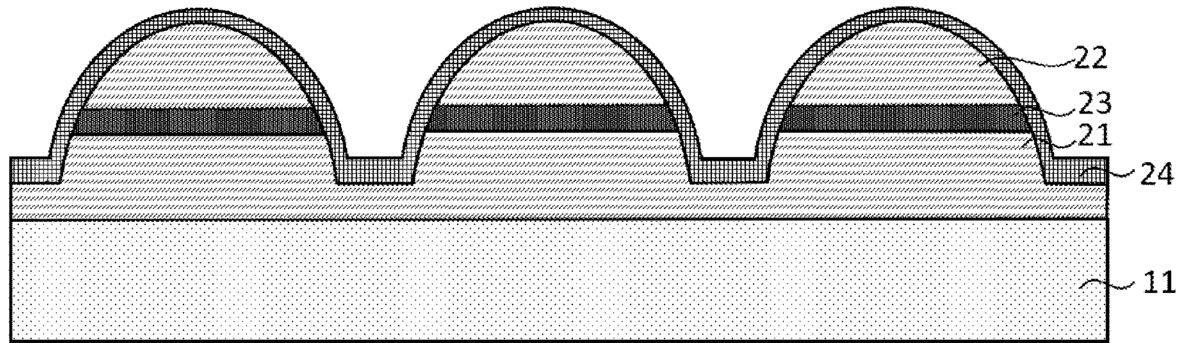
Figure 13:
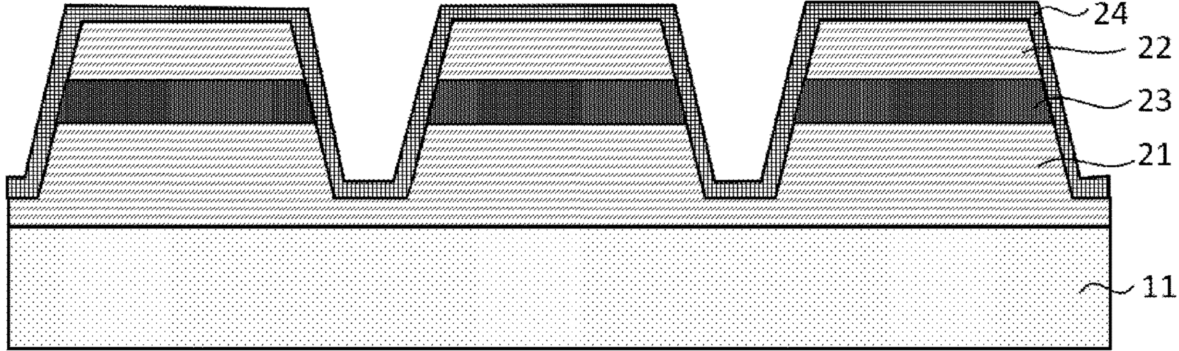

Specifically, as shown in FIGS. 10 and 13, step S30 includes: forming a reflective sidewall 24 on a side, away from the underlayment 11, of the second semiconductor layer 22, where the reflective sidewall 24 constitutes a sidewall of the active layer 23, the second semiconductor layer 22 and at least a part of the first semiconductor layer 21.

It should be noted that the reflective sidewall 24 may be a DBR, when preparing the reflective sidewall 24, two materials with different refractive indexes are alternately deposited on a side, away from the underlayment 11, of the first semiconductor layer 21, the active layer 23, and the second semiconductor layer 22, so as to form a direction of an alternating arrangement of the two materials perpendicular to a tangent plane where the reflective sidewall 24 is located. Optionally, two materials with different refractive indexes are selected from oxides including $TiO_2/SiO_2$, $Ti_3O_5/SiO_2$, $Ta_2O_5/SiO_2$, $Ti_3O_5/Al_2O_3$, $ZrO_2/SiO_2$, $TiO_2/Al_2O_3$ or the like. The present disclosure does not limit the two materials constituting the DBR, and therefore, a specific process for depositing the two materials is not limited neither.

In an embodiment, as shown in FIGS. 10 and 13, in S30, a shape, along a direction perpendicular to the underlayment 11, of the reflective sidewall 24 is linear or curved.

Specifically, as shown in FIGS. 1, 2, and 10, the shape of the reflective sidewall 24 is curved, and along the direction perpendicular to the substrate 10, there are countless tangent planes of the reflective sidewall 24, thereby increasing a reflection probability of light on the reflective sidewall 24, making the light concentrated, and further allowing the light to emit from the light-emitting unit 20 in a manner close to a collimated light. This is not only beneficial to improving the light emitting efficiency of the micro light-emitting diode chip, but also can adjust a light emitting angle by controlling a curvature of the curved reflective sidewall to achieve an effect of directional light emitting.

Specifically, as shown in FIGS. 3 and 13, the shape of the reflective sidewall 24 is linear. An included angle formed by the tangent plane where the reflective sidewall 24 is located and the plane where the substrate 10 is located is an acute angle, so that most of the light emitted from the active layer 23 in the light-emitting unit 20 is reflected by the reflective sidewall 24 and then emitted in a direction away from the substrate 10. The bowl shape of the reflective sidewall 24 is beneficial to improving the light emitting efficiency of the micro light-emitting diode chip.

Figure 14:
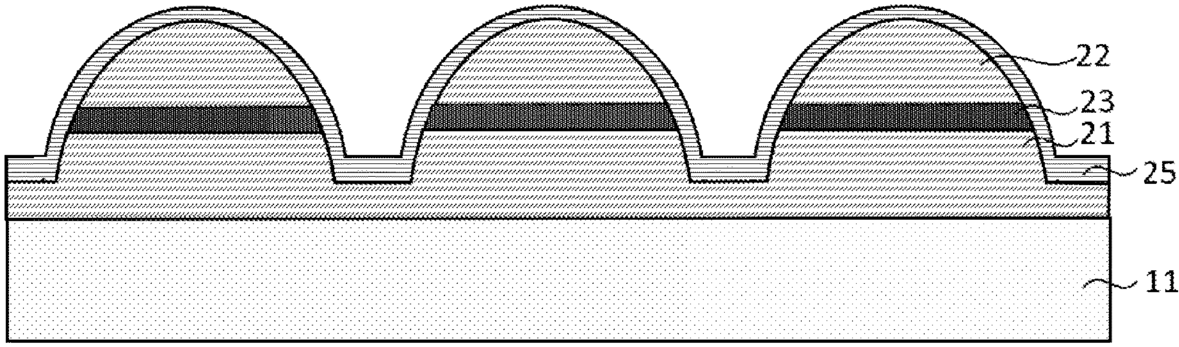
Figure 15:
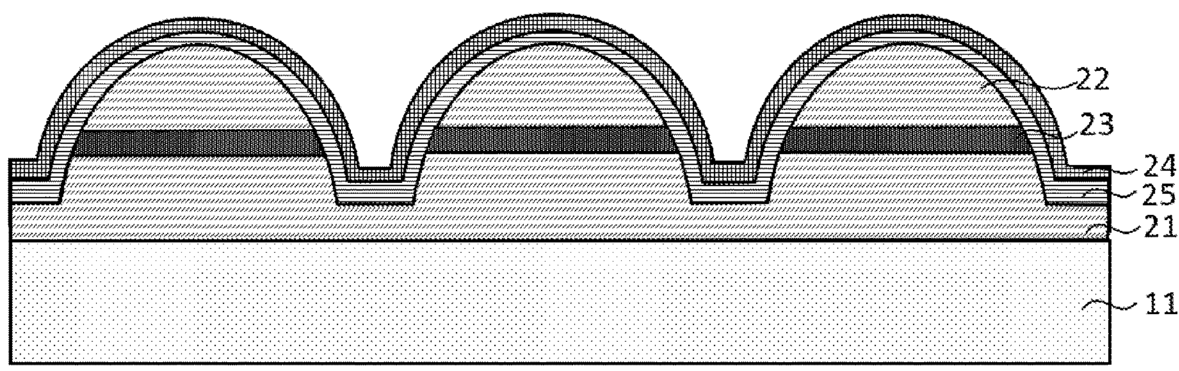

Optionally, in an embodiment, as shown in FIGS. 14 to 15, the manufacturing method for the micro light-emitting diode chip further includes a step between S20 and S30: forming a passivation layer 25 on the side, away from the underlayment 11, of the second semiconductor layer 22, where the passivation layer 25 is located on a side, near the active layer 23, of the reflective sidewall 24.

It should be noted that, as shown in FIG. 14, the step of forming the passivation layer is performed to deposit the passivation layer 25, after completing step S20: forming a plurality of light-emitting units 20 by patterning and etching the active layer 23, the second semiconductor layer 22 and at least a part of the first semiconductor layer 21. As shown in FIG. 15, step S30 is performed subsequently to deposit the reflective sidewall 24.

Specifically, the passivation layer 25 is dense, which may better cover the first semiconductor layer 21, the active layer 23 and the second semiconductor layer 22, protect the first semiconductor layer 21, the active layer 23 and the second semiconductor layer 22 from being affected by a subsequent preparation process, such as a process of preparing the reflective sidewall 24, and facilitate preparing a thin-layer structure of the reflective sidewall 24. Optionally, the passivation layer 25 may be $Al_2O_3$, AlN, $SiO_2$, SiN, SiON, $HfO_2$, $ZrO_2$, $Y_2O_3$, $La_2O_3$ or $Ta_2O_5$.

Figure 16:
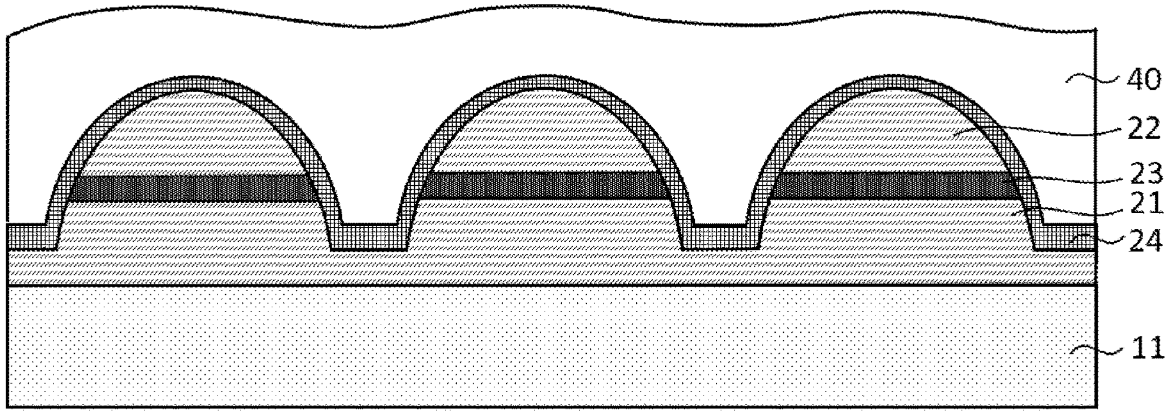

It should be noted that in other embodiments, as shown in FIG. 16, the passivation layer 25 is not illustrated, but the embodiment shown in FIG. 16 can also include a passivation layer structure.

Figure 17:
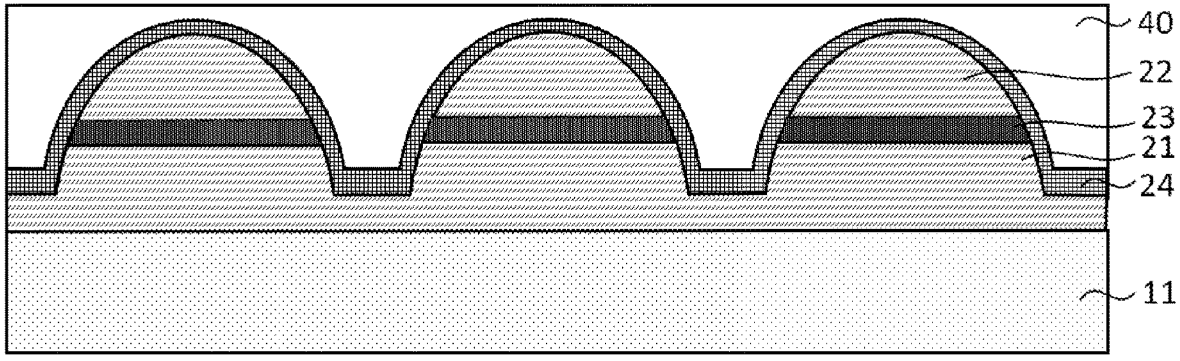
Figure 31:
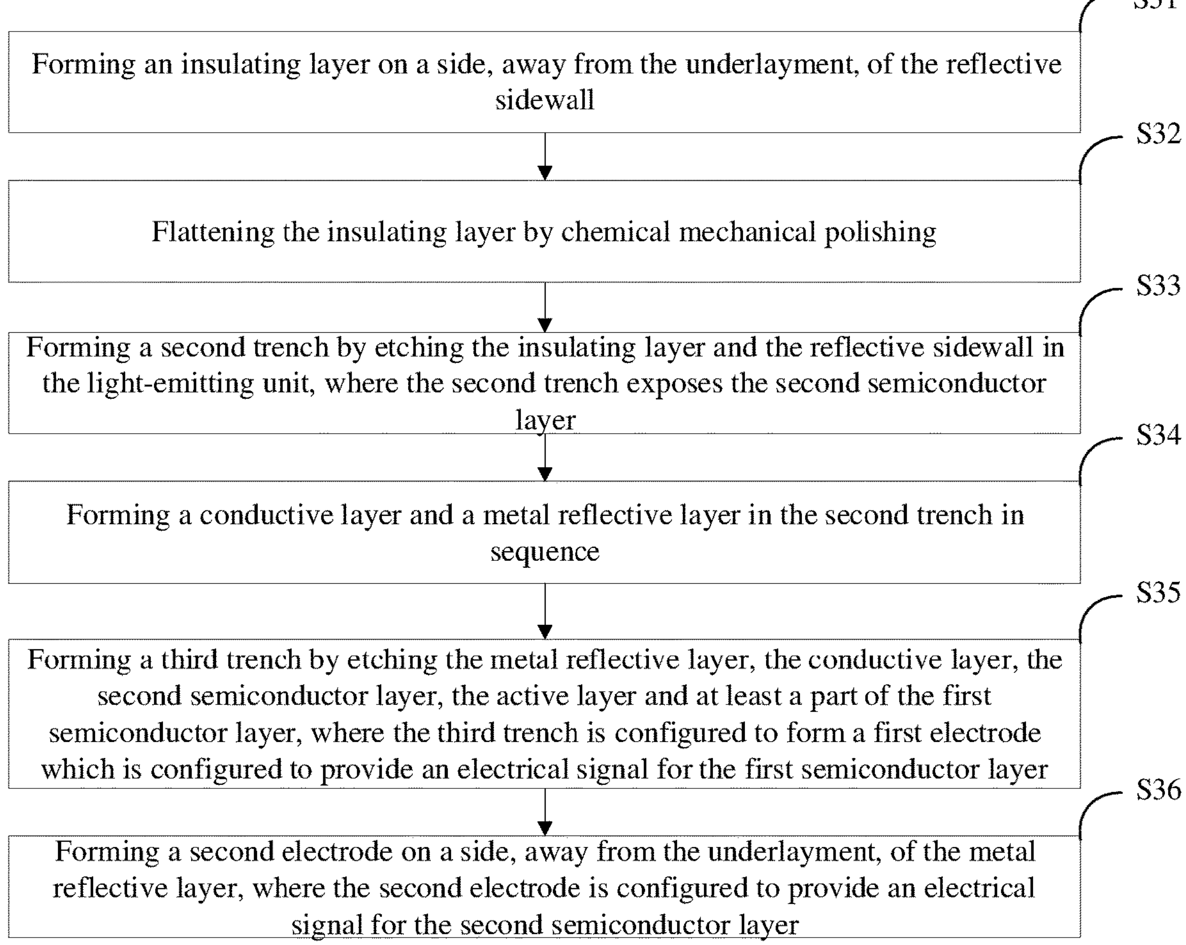
FIG. 31 is a schematic flowchart of a manufacturing method for a micro light-emitting diode chip according to another embodiment of the present disclosure.

Specifically, as shown in FIGS. 16, 17 and 31, in an embodiment, the manufacturing method for the micro light-emitting diode chip further includes S31: forming an insulating layer on a side, away from the underlayment, of the reflective sidewall; and S32: flattening the insulating layer by chemical mechanical polishing. S31 and S32 are performed between S30 and S40.

It should be noted that as shown in FIG. 16, after the formation of the insulating layer 40, a surface, away from the underlayment 11, of the insulating layer 40 is uneven, and the surface is flattened by chemical mechanical polishing to form a flat surface, away from the underlayment 11, of the insulating layer 40 as shown in FIG. 17.

It should be noted that the insulating layer 40 is disposed between the reflective sidewalls 24 of two light-emitting units 20, in other words, the insulating layer 40 is an integral structure including a trench array that can be used to accommodate the light-emitting unit 20. Optionally, the insulating layer 40 may be SiCN, $SiO_2$, SiN, $Al_2O_3$, $HfO_2$, $ZrO_2$, or $Ta_2O_5$.

Specifically, as shown in FIGS. 18 to 20, and 31, in an embodiment, the manufacturing method for the micro light-emitting diode chip further includes S33: forming a second trench by etching the insulating layer and the reflective sidewall in the light-emitting unit, where the second trench exposes the second semiconductor layer; and S34: forming a conductive layer and a metal reflective layer in the second trench in sequence. S33 and S34 are performed between S32 and S40.

Figure 18:
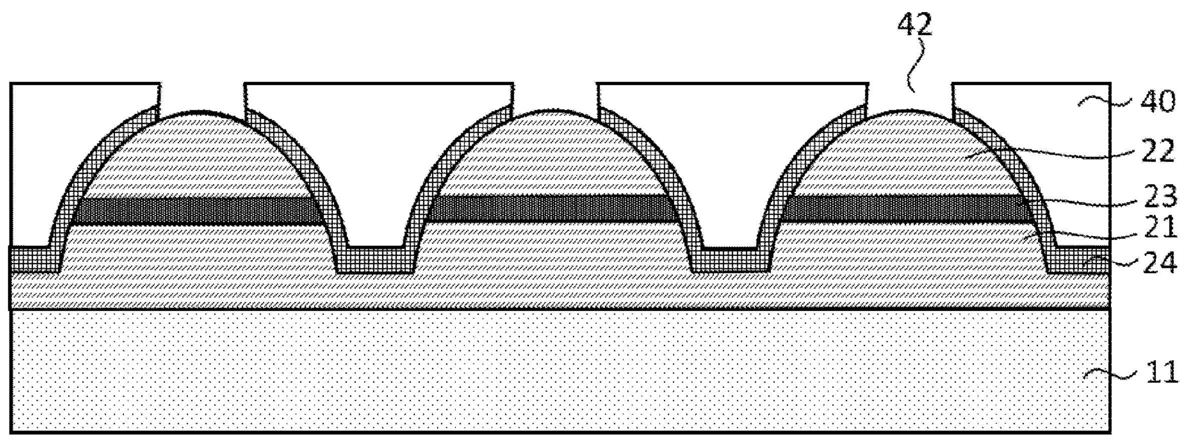

It should be noted that, as shown in FIG. 18, in step S33, the second trench 42 is formed by only etching the insulating layer 40 and the reflective sidewall 24. A surface, near the underlayment 11, of the second trench 42 is a curved structure that matches a shape of the second semiconductor layer 22. The second trench 42 exposes the second semiconductor layer 22, and finally a micro light-emitting diode chip as shown in FIG. 1 is formed. The surface, near the substrate 10, of the second semiconductor layer 22 is curved, so that a whole surface, near the substrate 10, of the light-emitting unit 20 presents a curved structure, thereby making the light to emit from the light-emitting unit 20 in a manner close to a collimated light. This is not only beneficial to improving the light emitting efficiency of the micro light-emitting diode chip, but also can adjust a light emitting angle by controlling a curvature of the curved reflective sidewall to achieve an effect of directional light emitting.

Figure 19:
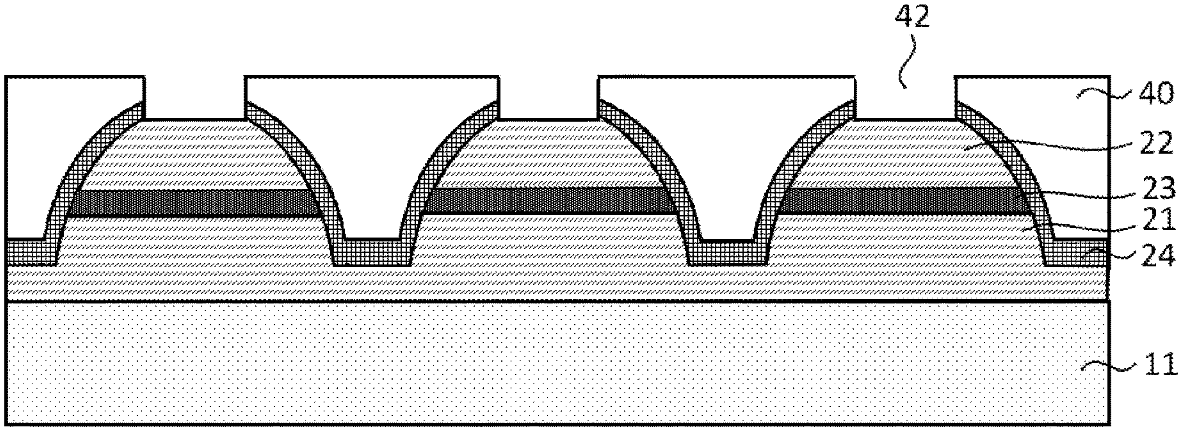

Optionally, as shown in FIG. 19, in step S33, the insulating layer 40 and the reflective sidewall 24 are etched, and the second semiconductor layer 22 is further etched to form a linear surface, near the underlayment 11, of the second trench 42 in a direction perpendicular to a plane where the underlayment 11 is located. The second trench 42 exposes the second semiconductor layer 22, and finally a micro light-emitting diode chip as shown in FIG. 2 is formed. A surface, near the substrate 10, of the second semiconductor layer 22 is linear, so that a subsequent manufacturing process for forming a flat structure is more convenient. The present disclosure does not limit the surface, near the substrate 10, of the second semiconductor layer 22 to be curved or linear.

Figure 20:
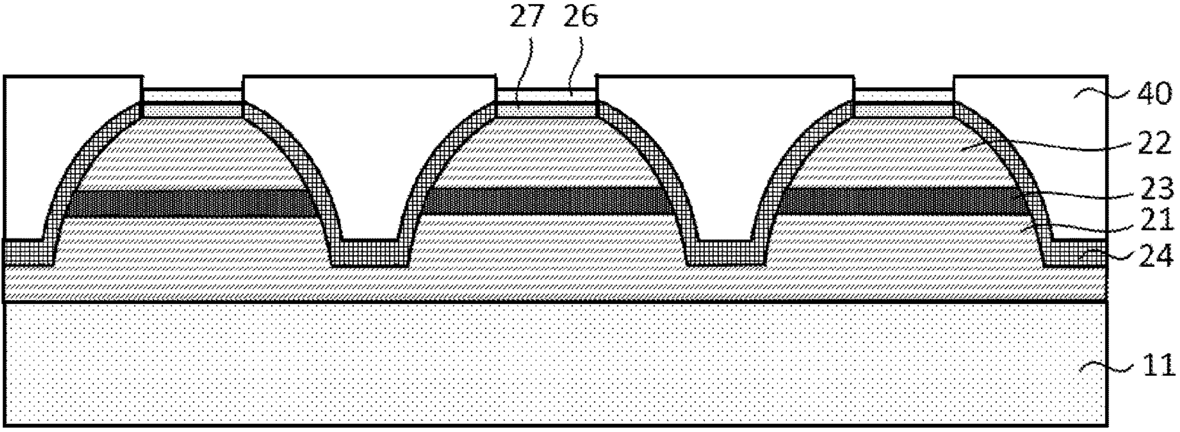

It should be noted that, as shown in FIG. 20, in step S34, a conductive layer 27 and a metal reflection layer 26 are sequentially formed in the second trench 42. Optionally, the conductive layer 27 may be a transparent conductive material, such as ITO, which may expand a current of the second electrode 52, so that a current entering the second semiconductor layer 22 may be more uniformly distributed, which is beneficial to improving the luminous efficiency of the micro light-emitting diode chip. Optionally, the metal reflective layer 26 may improve the problem of low reflection for the light emitted from the active layer 23 by the second electrode 52 disposed in the micro light-emitting diode chip.

Figure 21:
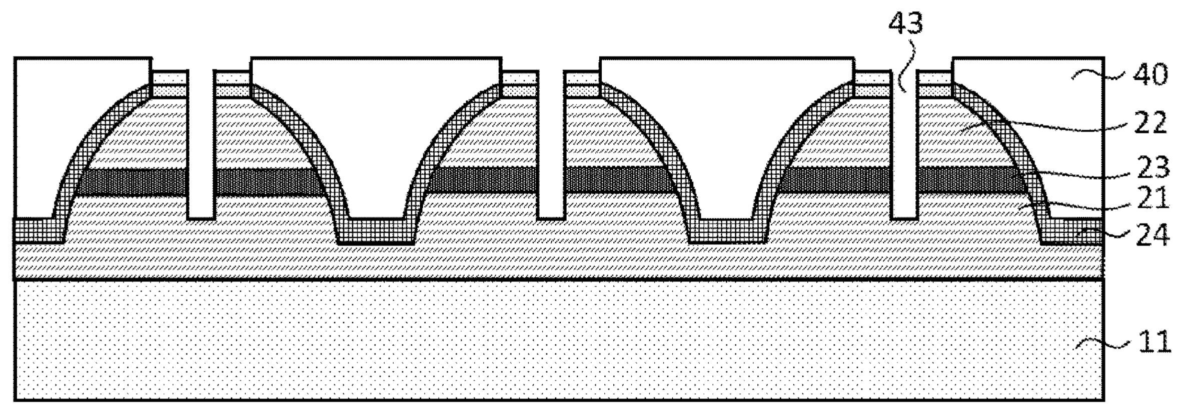
Figure 22:
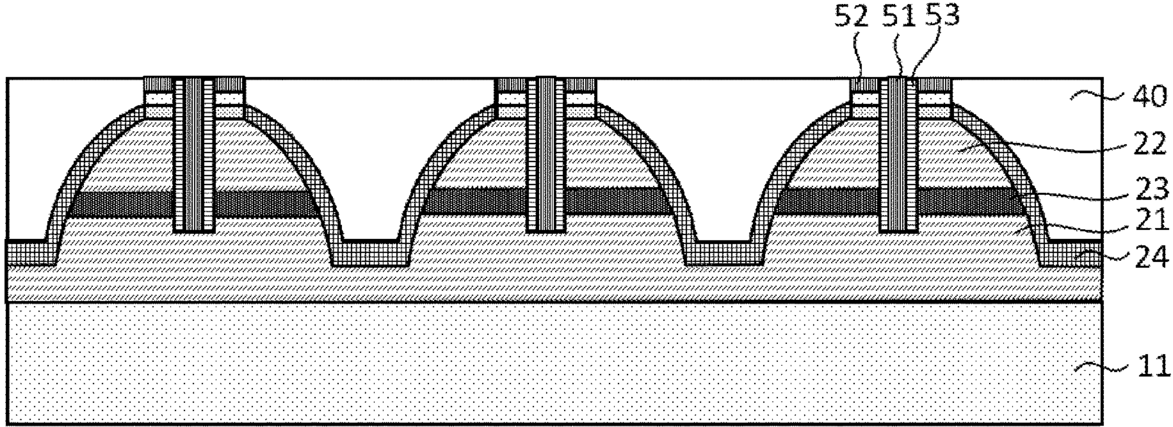

Specifically, referring to FIGS. 21, 22 and 31, in an embodiment, the manufacturing method for the micro light-emitting diode chip further includes S35: forming a third trench by etching the metal reflective layer, the conductive layer, the second semiconductor layer, the active layer and at least a part of the first semiconductor layer, where the third trench is configured to form a first electrode which is configured to provide an electrical signal for the first semiconductor layer; and S36: forming a second electrode on a side, away from the underlayment, of the metal reflective layer, where the second electrode is configured to provide an electrical signal for the second semiconductor layer. S35 and S36 are performed between S34 and S40.

It should be noted that after forming the third trench, step S35 further includes: forming an insulating material 53, and then etching the insulating material 53 to deposit the first electrode 51. The insulating material 53 is used to electrically insulate the first electrode 51 and the second semiconductor layer 22, and electrically insulate the first electrode 51 and the second electrode 52, so that electrical signals of the first semiconductor layer 21 and the second semiconductor layer 22 may be prevented from being disordered.

Figure 23:
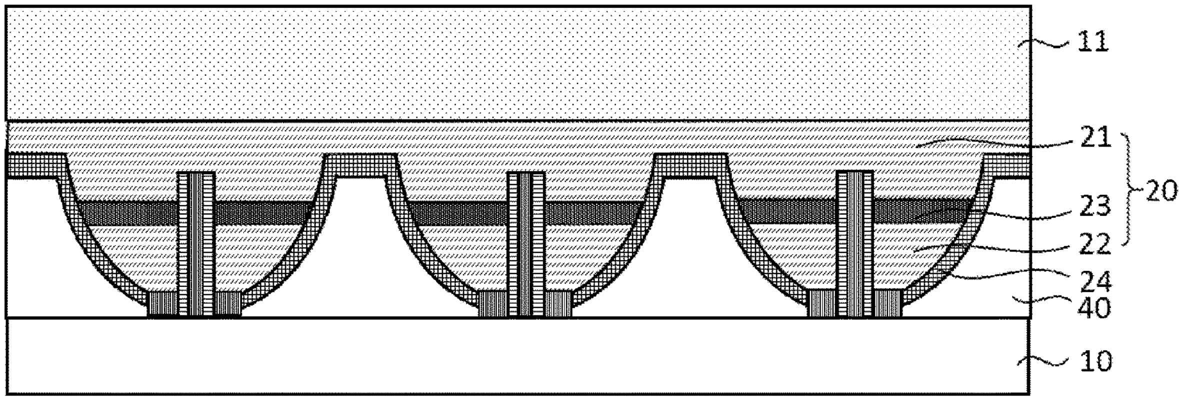

Specifically, as shown in FIG. 23, step S40 includes: inverting and transferring the underlayment 11 and a light-emitting unit 20 onto a substrate 10, where the light-emitting unit 20 is located between the underlayment 11 and the substrate 10.

Figure 24:
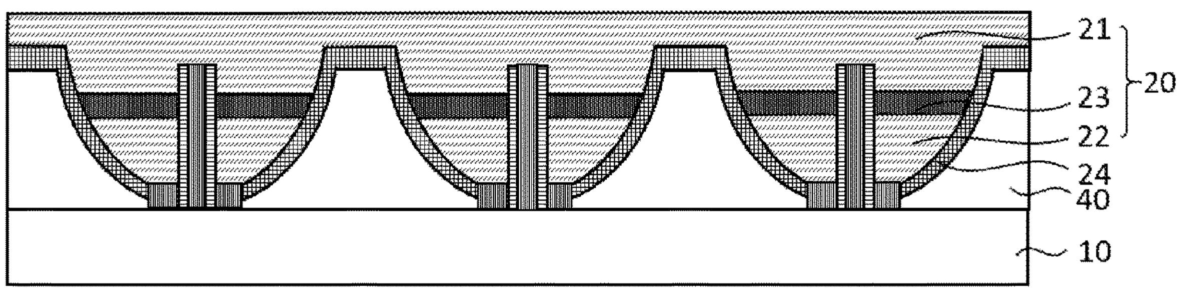

Specifically, as shown in FIG. 24, step S50 includes: removing the underlayment 11, where the first semiconductor layer 21 is located on a side, away from the substrate 10, of the second semiconductor layer 22.

Figure 25:
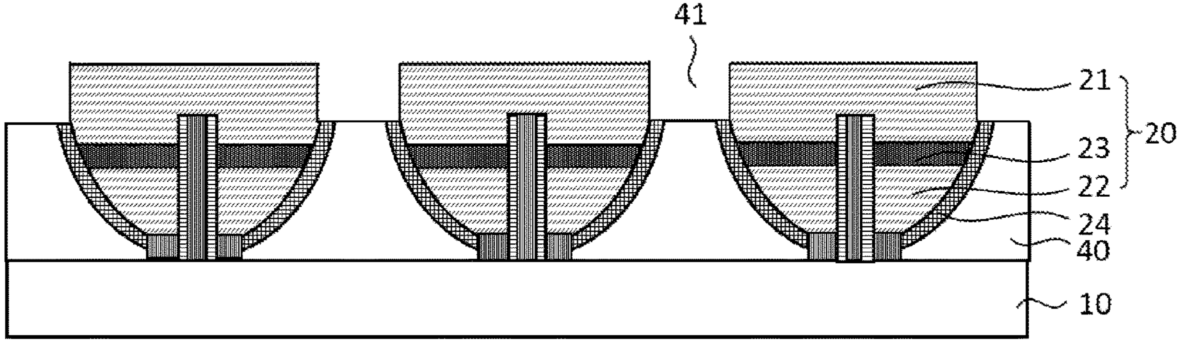

Specifically, as shown in FIG. 25, step S60 includes: forming a first trench 41 by etching the first semiconductor layer 21 between two of the light-emitting units 20.

Optionally, only the first semiconductor layer 21 is etched to form the first trench 41. Optionally, as shown in FIG. 25, the first semiconductor layer 21 and the reflective sidewall 24 located on a side, away from the substrate 10, of the insulating layer 40 are etched to form the first trench 41. Optionally, as shown in FIG. 5, the first semiconductor layer 21 is etched and the insulating layer 40 is penetrated to form the first trench 41.

Specifically, as shown in FIGS. 1 and 2, step S70 includes: forming a blocking portion 30 in the first trench 41, where at least a part of the blocking portion 30 is located between first semiconductor layers 21 of two of the light-emitting units 20.

Optionally, as shown in FIG. 2, the blocking portion 30 is a one-dimensional photonic crystal, which may be a DBR, composed of a material pair with two different refractive indexes, and the material pair includes a first material 31 and a second material 32. In a manufacturing process, the first material 31 may be deposited in the first trench 41 firstly, a vertical trench is formed by etching the first material 31, and then the second material 32 may be deposited in the vertical trench to form a DBR composed of the first material 31 and the second material 32. A direction of an alternating arrangement of the first material 31 and the second material 32 is parallel to the plane where the substrate 10 is located. It should be noted that the periodicity of the DBR material pair in the present disclosure is not limited by the periodicity of the DBR material pair shown in FIG. 2, those skilled in the art may select a suitable periodicity of the DBR material pair according to actual reflection requirements.

Optionally, as shown in FIG. 3, the blocking portion 30 is a three-dimensional photonic crystal composed of a material pair with two different refractive indexes, and the material pair includes a first material 31 and a second material 32. It should be noted that a cross-section of the photonic crystal shown in FIG. 3 is rectangular. In other embodiments, the three-dimensional structure of the photonic crystal may be a vertical cylinder, a sphere, a wooden pile type, and a combination of these. Specifically, the photonic crystal may be prepared by using a method such as electron beam direct writing, nanoimprint, high-end microfilm projection exposure machine, and holographic exposure, which is not limited in the present disclosure. Specifically, the three-dimensional photonic crystal may be prepared by using a method of regularly bottom-up arranging small sized ions with a uniform size, a size level may be micron or nanometer, and specifically, a photolithography method or an ion beam etching method in a conventional semiconductor process may be used.

Figure 26:
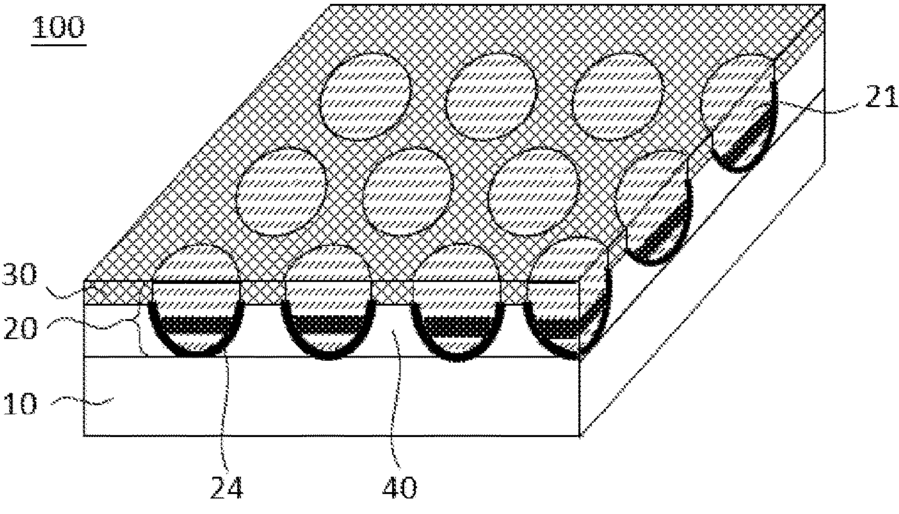
FIG. 26 is a three-dimension structural schematic diagram of a micro light-emitting diode chip according to an embodiment of the present disclosure.

FIG. 26 is a three-dimension structural schematic diagram of a micro light-emitting diode chip according to an embodiment of the present disclosure. As shown in FIG. 26, the micro light-emitting diode chip 100 illustrated in the embodiments of the present disclosure includes: a substrate 10, a light-emitting unit 20 and a blocking portion 30 stacked in sequence. The light-emitting unit 20 includes a reflective sidewall 24 located near the substrate 10, and the blocking portion 30 is located between first semiconductor layers 21 of adjacent two light-emitting units 20. The reflective sidewall 24 reflects the light emitted from the active layer 23 at least once, and emits the light towards a side where the first semiconductor layer 21 is located. The blocking portion 30 is configured to prevent color crosstalk between the first semiconductor layers 21 of two light-emitting units 20, and modulate the light emitting angle of the light, so that the emergent light is collected to be close to a collimated light for emission, which is beneficial to improving brightness, thereby improving a display effect.

It should be noted that FIG. 26 only illustrates that a projection of the light-emitting unit 20 on the substrate 10 is circular, and the shape of the reflective sidewall 24 is composed of an arc. In other embodiments, the reflective sidewall 24 of the micro light-emitting diode chip 100 may also be composed of multiple broken lines. In other embodiments, the projection of the light-emitting unit 20 on the substrate 10 may be hexagonal, square, or other shapes. Specifically, since FIG. 26 is a 3D structural schematic diagram under an oblique of view, the projection of the light-emitting unit 20 on the substrate 10 is shown as an ellipse.

It should be noted that FIG. 26 only illustrates 4×3 light-emitting units 20, and the present disclosure does not limit the number of light-emitting units 20 included in the micro light-emitting diode chip. The light-emitting unit 20 located at the bottommost side or the rightmost side is a cross-sectional structure, and dimensions of the light-emitting unit 20 and other structures in the figure are only used to illustrate a positional relationship and do not represent real dimensions of each structure of the micro light-emitting diode chip. Specifically, FIG. 26 only illustrates a matrix arrangement in which each light-emitting unit 20 is aligned in the row and column directions. In an actual structure of a micro light-emitting diode chip, the light-emitting units 20 may also be arranged in a staggered manner.

As an optional implementation of the present disclosure, an electronic device is provided by an embodiment of the present disclosure, and the electronic device includes a micro light-emitting diode chip provided by any embodiment above. The electronic device may be a near eye display device, such as a Near Eye Display (NED) device, or an Augmented Reality (AR) glass.

Figure 27:
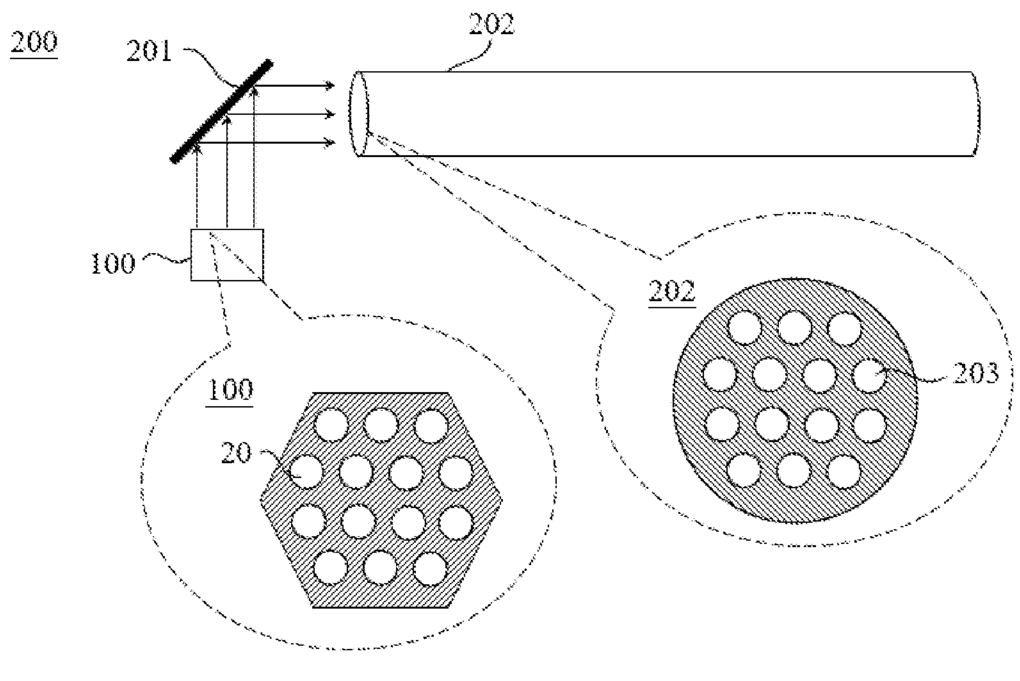
FIG. 27 is a structural schematic diagram of an electronic device according to an embodiment of the present disclosure.

In an embodiment, as shown in FIG. 27, FIG. 27 is a structural schematic diagram of an electronic device according to an embodiment of the present disclosure, and the electronic device 200 includes a micro light-emitting diode chip 100 provided by other embodiments of the present disclosure, a reflective structure 201, and an optical fiber structure 202. The reflective structure 201 turns the light emitted from the micro light-emitting diode chip 100 to the optical fiber structure 202, and the optical fiber structure 202 transmits the light, thereby achieving optical communication.

Specifically, light-emitting units 20 of the micro light-emitting diode chip 100 correspond to optical fibers 203 of the optical fiber structure 202 in number and arrangement manner, so that the emergent light of a light-emitting unit 20 may be transmitted by a corresponding optical fiber 203, and long-distance optical communication may be achieved. Optionally, the micro light-emitting diode chip 100 may display image information, finally achieving optical communication that can display image information.

Figure 28:
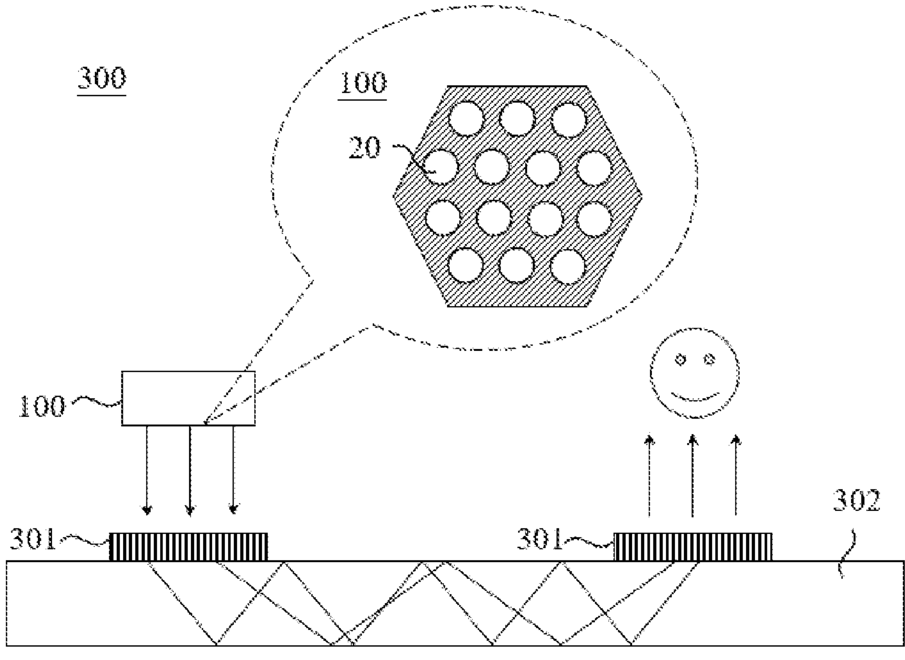
FIG. 28 is a structural schematic diagram of an electronic device according to another embodiment of the present disclosure.

In an embodiment, as shown in FIG. 28, FIG. 28 is a structural schematic diagram of an electronic device according to another embodiment of the present disclosure, and the electronic device 300 includes a micro light-emitting diode chip 100 provided by other embodiments of the present disclosure, a grating structure 301, and an optical waveguide structure 302. The grating structure 301 couples the light emitted from the micro light-emitting diode chip 100 into the optical waveguide structure 302, and the optical waveguide structure 302 transmits the light. The light is then coupled out through the grating structure 301 and received by human eyes, thereby achieving human-computer interaction technology of augmented reality. Optionally, the micro light-emitting diode chip 100 may display image information, finally achieving AR technology that can display image information.

Figure 29:
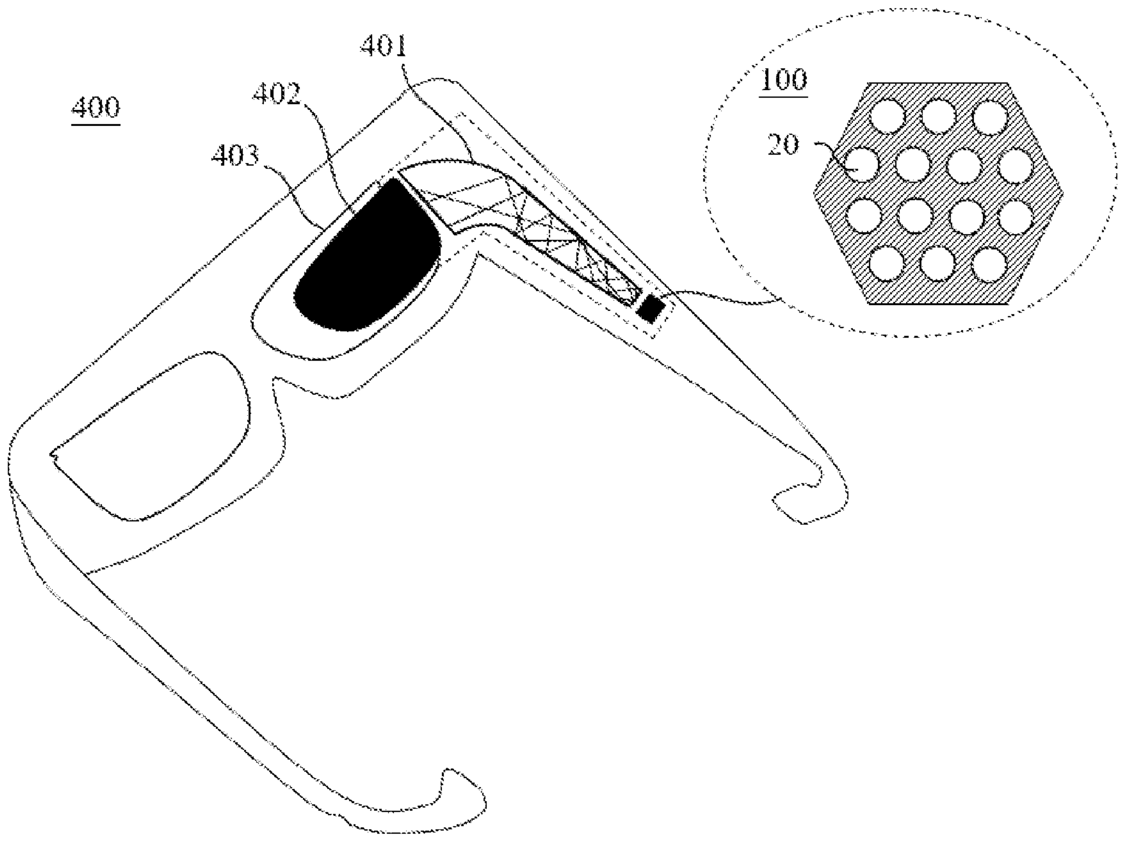
FIG. 29 is a structural schematic diagram of an electronic device according to another embodiment of the present disclosure.

In an embodiment, as shown in FIG. 29, FIG. 29 is a structural schematic diagram of an electronic device according to another embodiment of the present disclosure, and the electronic device 400 includes a micro light-emitting diode chip 100 provided by other embodiments of the present disclosure, an optical waveguide structure 401, a virtual picture display portion 402, and a perspective portion 403. The optical waveguide structure 401 transmits the light emitted from the micro light-emitting diode chip 100 to the virtual picture display portion 402, and the perspective portion 403 may be used for transmitting light in real world. By combining the virtual picture display portion 402 and the perspective portion 403, human eyes may receive picture information projected from a virtual picture into the real world, thereby enhancing the virtual reality experience.

It should be noted that as shown in FIGS. 27 to 29, the electronic device only includes one light-emitting chip (micro light-emitting diode chip) 100, which integrates 14 light-emitting units 20. A cross-sectional shape of the light-emitting chip 100 is hexagonal, and a cross-sectional shape of the light-emitting unit 20 is circular. The embodiments of the present disclosure do not limit the cross-sectional shape of the light-emitting chip 100 and the light-emitting unit 20, and do not limit an arrangement manner of the light-emitting units 20.

The embodiments of the present disclosure provide a micro light-emitting diode chip, which includes: a substrate; a plurality of light-emitting units, where a light-emitting unit is located on a side of the substrate, the light-emitting unit includes a first semiconductor layer, an active layer and a second semiconductor layer stacked in sequence, the first semiconductor layer is located on a side, away from the substrate, of the second semiconductor layer, and the light-emitting unit further includes a reflective sidewall, which constitutes a sidewall of the active layer, the second semiconductor layer and at least a part of the first semiconductor layer; and a blocking portion, where at least a part of the blocking portion is located between first semiconductor layers of two of the light-emitting units. The reflective sidewall reflects the light emitted from the active layer at least once, and emits the light towards a side where the first semiconductor layer is located. The blocking portion is configured to prevent color crosstalk between the first semiconductor layers of two light-emitting units, and modulate the light emitting angle of the light, so that the emergent light is collected to be close to a collimated light for emission, which is beneficial to improving brightness, thereby improving a display effect.

It should be understood that the term “including” and its variations used in the present disclosure are open-ended, that is, “including but not limited to”. The term “one embodiment” means “at least one embodiment”, the term “another embodiment” means “at least one other embodiment”. In this specification, the schematic expressions of the above terms do not necessarily refer to the same embodiments or examples. Moreover, the described specific features, structures, materials, or characteristics may be combined in an appropriate manner in any one or more embodiments or examples. In addition, those of skill in the art may combine and permutation the different embodiments or examples described in this specification, as well as the features of different embodiments or examples, without contradiction.

The above-mentioned embodiments are only the preferred embodiments of the present disclosure, and not intended to limit the protection scope of the present disclosure. Any modification, equivalent replacement, improvement and so on that made in the spirit and principle of the present disclosure shall fall into the protection scope of the present disclosure.

What is claimed is:

1. A micro light-emitting diode chip, comprising:

a substrate;

a plurality of light-emitting units, wherein a light-emitting unit is located on a side of the substrate, the light-emitting unit comprises a first semiconductor layer, an active layer and a second semiconductor layer stacked in sequence, the first semiconductor layer is located on a side, away from the substrate, of the second semiconductor layer, and the light-emitting unit further comprises a reflective sidewall, which constitutes a sidewall of the active layer, the second semiconductor layer and at least a part of the first semiconductor layer; and a blocking portion, wherein at least a part of the blocking portion is located between first semiconductor layers of two of the light-emitting units.

2. The micro light-emitting diode chip according to claim 1, wherein the blocking portion is a photonic crystal.

3. The micro light-emitting diode chip according to claim 1, wherein the reflective sidewall is a distributed Bragg reflector.

4. The micro light-emitting diode chip according to claim 1, wherein in the light-emitting unit, along a direction parallel to the substrate, a length of the first semiconductor layer is greater than a length of the second semiconductor layer.

5. The micro light-emitting diode chip according to claim 4, wherein a shape, along a direction perpendicular to the substrate, of the reflective sidewall is curved or linear.

6. The micro light-emitting diode chip according to claim 1, further comprising:

a passivation layer located on a side, near the active layer, of the reflective sidewall.

7. The micro light-emitting diode chip according to claim 1, further comprising:

an insulating layer located between reflective sidewalls of two of the light-emitting units, wherein the blocking portion constitutes a sidewall of at least a remaining part of the first semiconductor layer.

8. The micro light-emitting diode chip according to claim 7, wherein the blocking portion penetrates through the insulating layer.

9. The micro light-emitting diode chip according to claim 1, further comprising:

a first electrode, wherein along a direction perpendicular to the substrate, the first electrode penetrates through the active layer and the second semiconductor layer and is electrically connected to the first semiconductor layer, and the first electrode is configured to provide an electrical signal for the first semiconductor layer; and/or a second electrode, wherein the second electrode is electrically connected to the second semiconductor layer, and the second electrode is configured to provide an electrical signal for the second semiconductor layer.

10. The micro light-emitting diode chip according to claim 9, further comprising:

a metal reflective layer located on a side, away from the active layer, of the second semiconductor layer, wherein the second electrode is electrically connected to the second semiconductor layer through the metal reflective layer.

11. The micro light-emitting diode chip according to claim 10, wherein the metal reflective layer comprises a Ni metal layer and an Ag metal layer, and the Ni metal layer is located on a side, near the second semiconductor layer, of the Ag metal layer.

12. The micro light-emitting diode chip according to claim 10, further comprising:

a conductive layer located between the metal reflective layer and the second semiconductor layer.

13. An electronic device, comprising a micro light-emitting diode chip, wherein the micro light-emitting diode chip comprises:

a substrate;

a plurality of light-emitting units, wherein a light-emitting unit is located on a side of the substrate, and the light-emitting unit comprises a first semiconductor layer, an active layer and a second semiconductor layer stacked in sequence, the first semiconductor layer is located on a side, away from the substrate, of the second semiconductor layer, and the light-emitting unit further comprises a reflective sidewall, which constitutes a sidewall of the active layer, the second semiconductor layer and at least a part of the first semiconductor layer; and a blocking portion, wherein at least a part of the blocking portion is located between first semiconductor layers of two of the light-emitting units.

* * * * *